US012166037B2

(12) United States Patent
Chen et al.

(10) Patent No.: US 12,166,037 B2
(45) Date of Patent: Dec. 10, 2024

(54) ISOLATION LAYERS IN STACKED SEMICONDUCTOR DEVICES

(71) Applicant: Taiwan Semiconductor Manufacturing Co., Ltd., Hsinchu (TW)

(72) Inventors: Wei-Lun Chen, Taipei (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 445 days.

(21) Appl. No.: 17/459,803

(22) Filed: Aug. 27, 2021

(65) Prior Publication Data

US 2023/0066265 A1    Mar. 2, 2023

(51) Int. Cl.
*H01L 27/092* (2006.01)
*H01L 21/8238* (2006.01)
(Continued)

(52) U.S. Cl.
CPC .... *H01L 27/092* (2013.01); *H01L 21/823807* (2013.01); *H01L 21/823814* (2013.01);
(Continued)

(58) Field of Classification Search
CPC .......... H01L 27/092; H01L 21/823807; H01L 21/823814; H01L 21/823828; H01L 21/823878; H01L 29/0665; H01L 29/42392; H01L 29/66545; H01L 29/78696; H01L 21/8221; H01L 27/0688; H01L 29/0673; H01L 29/0847;
(Continued)

(56) References Cited

U.S. PATENT DOCUMENTS 9,093,530 B2    7/2015 Huang et al.
9,171,929 B2   10/2015 Lee et al.
(Continued)

OTHER PUBLICATIONS

Xu et al., "Designing a Practical Access Point Association Protocol", Technical Program at IEEE INFOCOM 2010, 2010, College of William and Mary, VA, pp. 1-9.

*Primary Examiner* — Tong-Ho Kim
(74) *Attorney, Agent, or Firm* — Sterne, Kessler, Goldstein & Fox P.L.L.C.

(57) ABSTRACT

A semiconductor device and methods of fabricating the same are disclosed. The method includes forming a fin structure on a substrate, forming a superlattice structure with first and second nanostructured layers on the fin structure, forming a polysilicon structure around the superlattice structure, forming a source/drain opening within the superlattice structure, forming a first conductivity type S/D region within a first portion of the S/D opening, forming an isolation layer on the first conductivity type S/D region and within a second portion of the S/D opening, forming a second conductivity type S/D region on the isolation layer and within a third portion the S/D opening, and replacing the polysilicon structure and the second nanostructured layers with a gate structure that surrounds the first nanostructured layers. Materials of the first and second nanostructured layers are different from each other and the second conductivity type is different from the first conductivity type.

20 Claims, 42 Drawing Sheets

(51) Int. Cl.
*H01L 29/06* (2006.01)
*H01L 29/423* (2006.01)
*H01L 29/66* (2006.01)
*H01L 29/786* (2006.01)

(52) U.S. Cl.
CPC ............... *H01L 21/823828* (2013.01); *H01L 21/823878* (2013.01); *H01L 29/0665* (2013.01); *H01L 29/42392* (2013.01); *H01L 29/66545* (2013.01); *H01L 29/78696* (2013.01)

(58) Field of Classification Search
CPC ............. H01L 29/66439; H01L 29/165; H01L 29/7848; H01L 29/775; B82Y 10/00
USPC ......................................................... 257/369
See application file for complete search history.

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 11,348,921 B2 | 5/2022 | Chen |
| 2019/0148376 A1* | 5/2019 | Chanemougame ......................... H01L 27/0688 257/532 |
| 2019/0172751 A1* | 6/2019 | Smith ................. H01L 29/1033 |
| 2021/0265345 A1* | 8/2021 | Xie ................. H01L 21/823864 |

\* cited by examiner

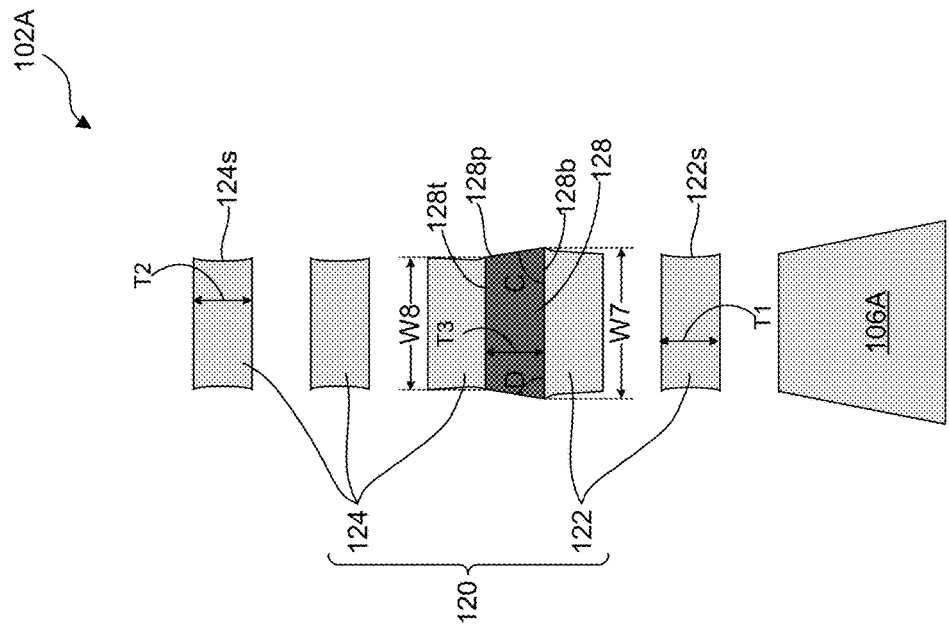
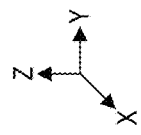
Fig. 1E
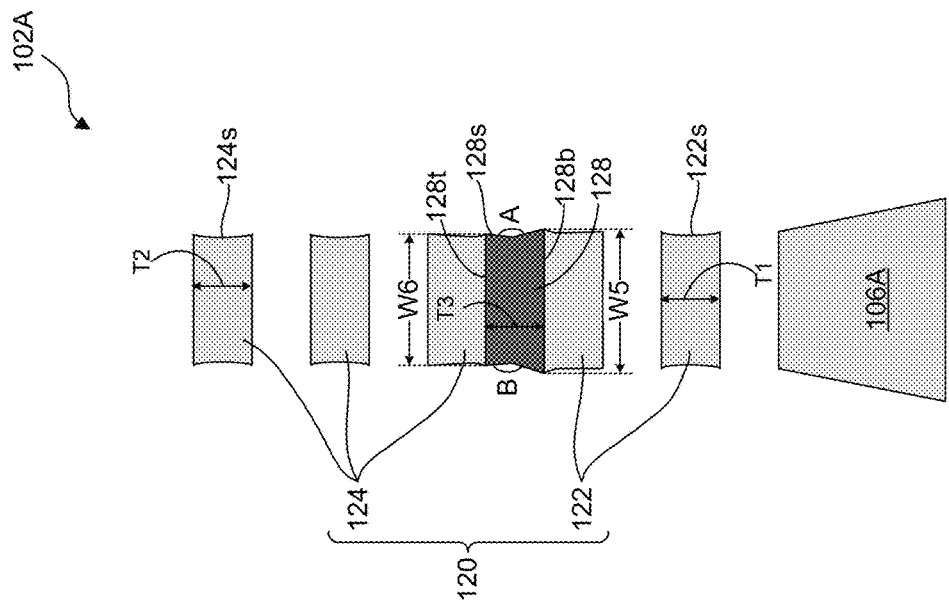
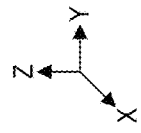
Fig. 1D

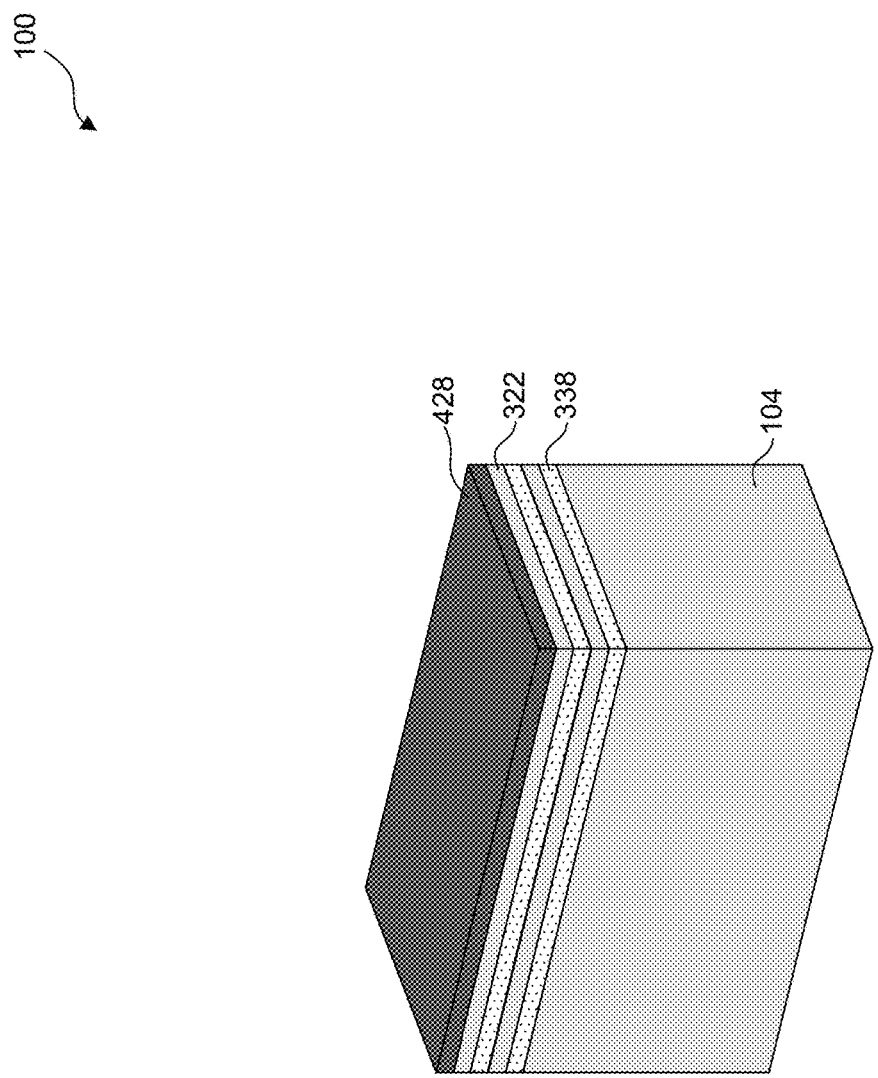
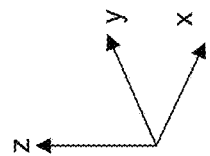
Fig. 4

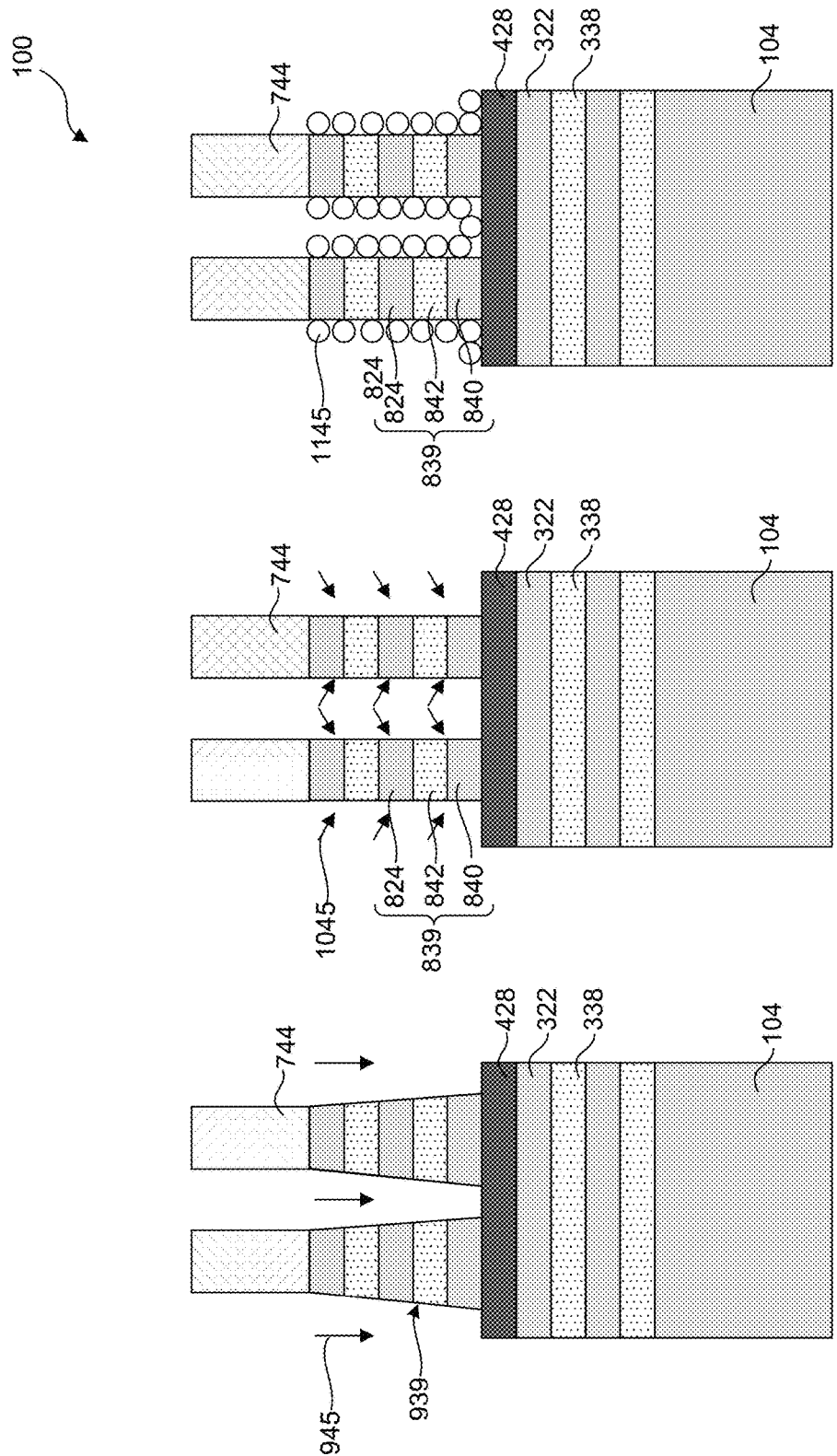

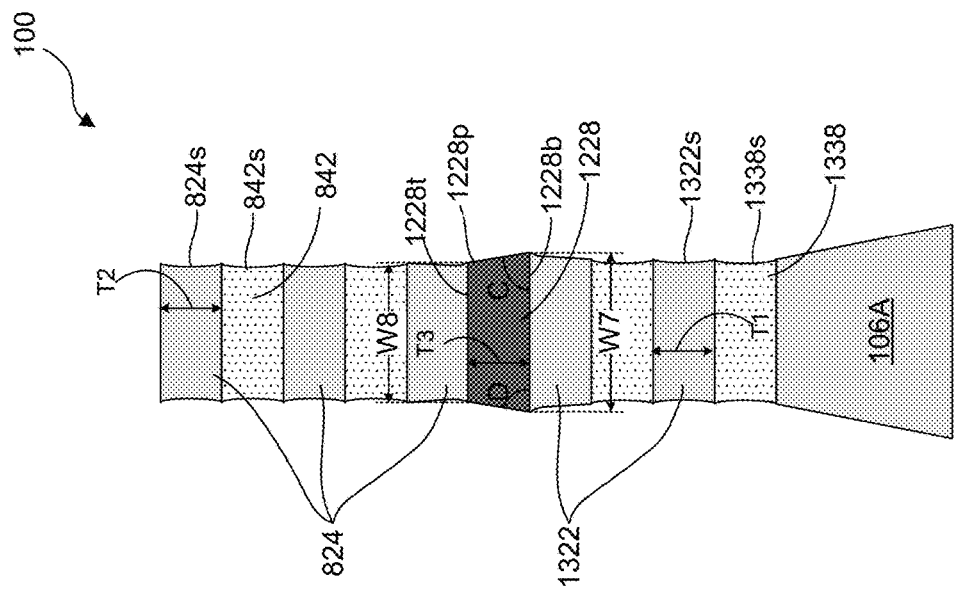
Fig. 16
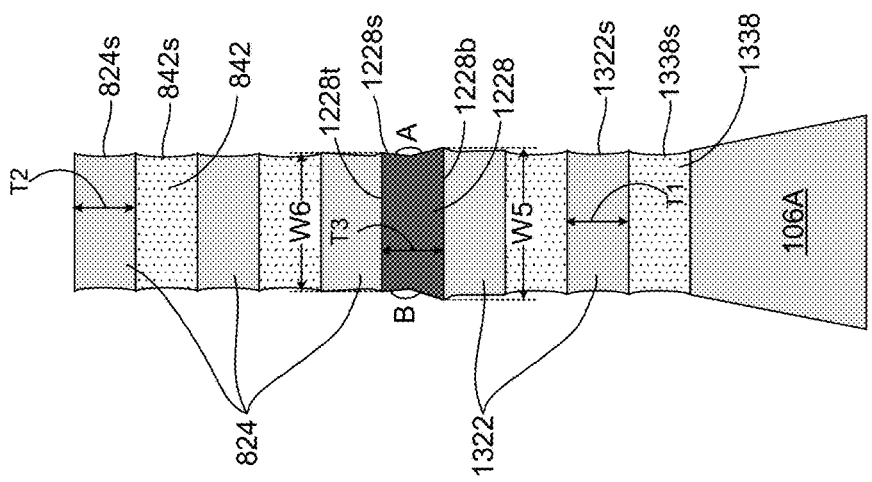
Fig. 15
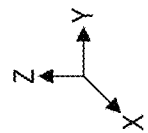

ISOLATION LAYERS IN STACKED SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1B-1G and 1I-1J illustrate cross-sectional views of semiconductor devices with stacked FETs, in accordance with some embodiments.

FIGS. 3-8, 12-14, and 17-18 illustrate isometric views of a semiconductor device with stacked FETs at various stages of its fabrication process, in accordance with some embodiments.

FIGS. 9-11, 15-16, and 19-31 illustrate cross-sectional views of a semiconductor device with stacked FETs at various stages of its fabrication process, in accordance with some embodiments.

Figure 1A:
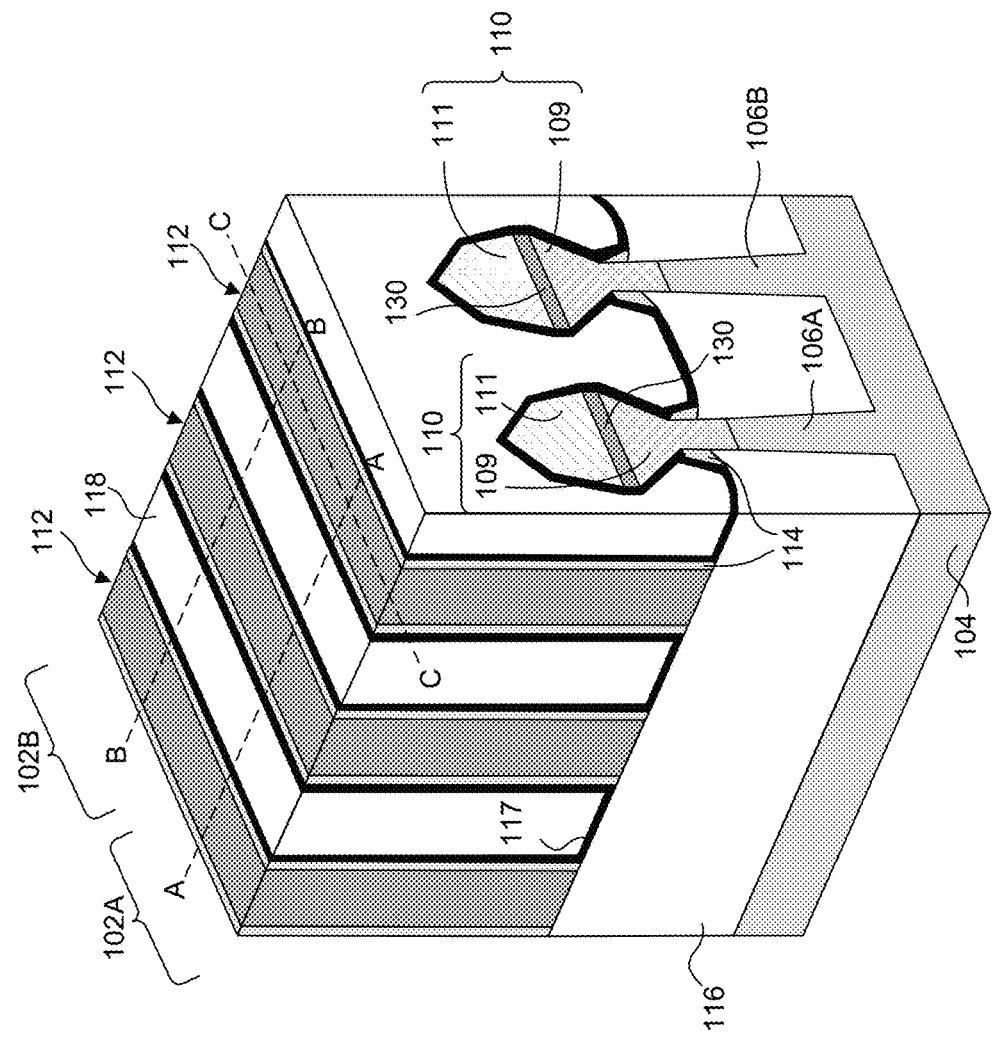
FIGS. 1A and 1H illustrate isometric views of semiconductor devices with stacked FETs, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The increasing demand for small, portable multifunctional electronic devices has increased the demand for low power devices that can perform increasingly complex and sophisticated functions while providing ever-increasing storage capacity. As a result, there is a continuing trend in the semiconductor industry to manufacture low-cost, high-performance, and low-power semiconductor devices in integrated circuits (ICs). These goals have been achieved in large part by scaling down the dimensions of the semiconductor devices, and thus increasing the device density of the ICs. The scaling down of the device dimensions facilitate faster circuit performance (e.g., faster switching speeds) and lead to higher effective yield in device fabrication processes by packing more devices on a semiconductor die. However, continued scaling also introduces considerable device fabrication challenges. The device density is limited by the amount of area that is required between devices in order to electrically isolate them from each other.

The present disclosure provides example semiconductor devices with stacked FETs (e.g., stacked gate-all-around (GAA) FETs) and example methods of forming the same. With the use of stacked FETs, the device density of ICs can be increased without aggressively scaling down the devices and compromising the electrical isolation between the devices in the IC. In some embodiments, the stacked FET can include a first conductivity type (e.g., n-type) FET disposed on a second conductivity type (e.g., p-type) FET. The stacked FET can further include a FET isolation layer disposed between the first and second conductivity type FETs to electrically isolate them from each other. In some embodiments, the FET isolation layer can include a channel isolation layer and a source/drain (S/D) isolation layer. The channel isolation layer can electrically isolate the channel regions of the first and second conductivity type FETs from each other. The S/D isolation layer can electrically isolate the S/D regions of the first and second conductivity type FETs from each other.

In some embodiments, the first and second conductivity type FETs can include GAA FETs. The first conductivity type GAA FET can include a stack of first conductivity type nanostructured channel regions and the second conductivity type GAA FET can include a stack of second conductivity type nanostructured channel regions. In some embodiments, the semiconductor materials of the first and second conductivity type nanostructured channel regions can be the same or can be different from each other. The stack of first conductivity type nanostructured channel regions can be disposed on and electrically isolated from the stack of second conductivity type nanostructured channel regions by the channel isolation layer. In some embodiments, the first and second conductivity type nanostructured channel regions can be surrounded by a common multi-layered gate structure.

In some embodiments, the stacked GAA FETs can be formed on a semiconductor substrate or on a silicon-on-insulator (SOI) substrate. The formation of the stacked GAA FETs on the SOI substrate can eliminate the need for electrical isolation with shallow trench isolation (STI) regions between adjacent stacked GAA FETs and/or between stack GAA FETs and other devices on the SOI substrate. The buried oxide layer of the SOI substrate can electrically isolate stacked GAA FETs from adjacent devices. As a result, the formation of the stacked GAA FETs on the SOI substrate can simplify the device fabrication process and reduce device manufacturing cost by eliminating the STI region fabrication steps.

Figure 1B:
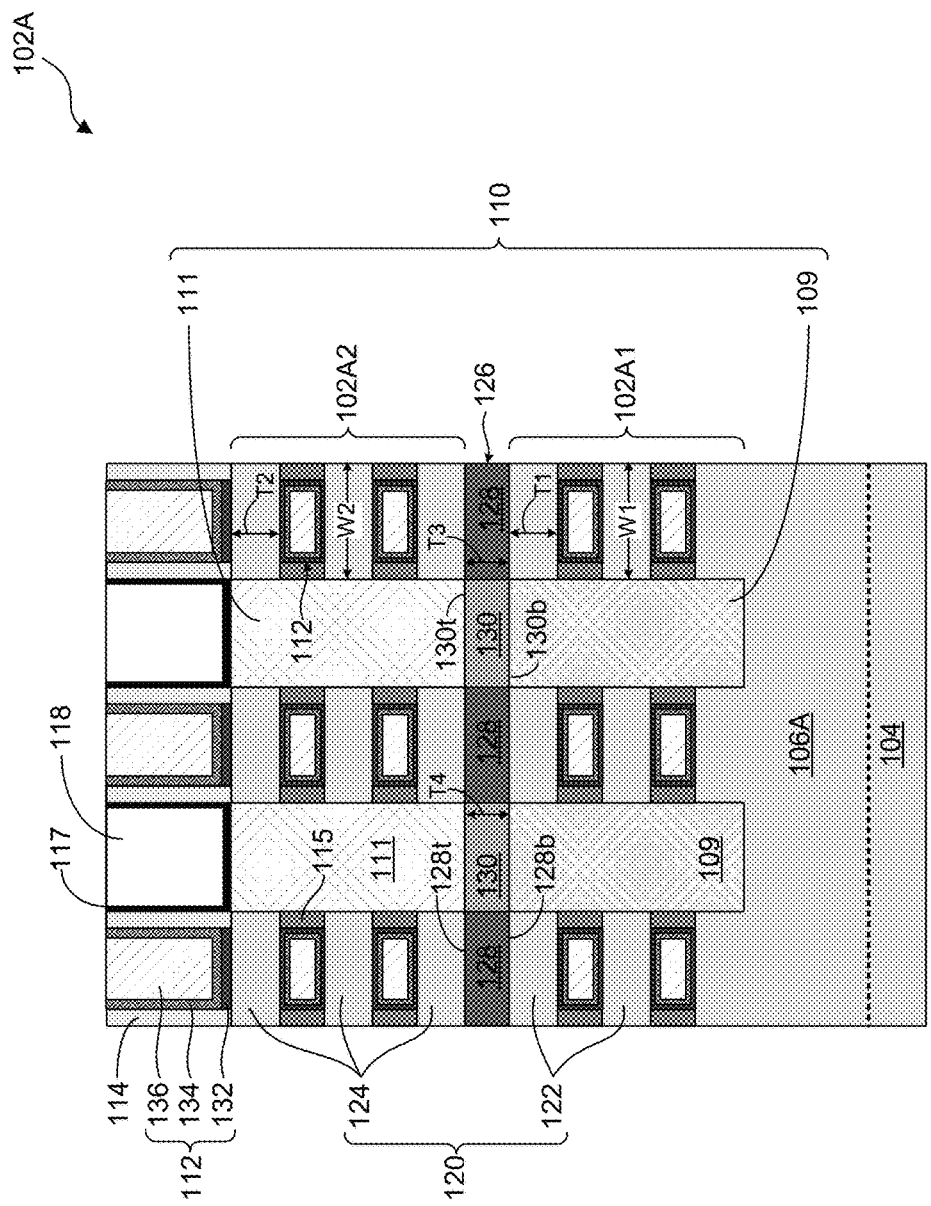
Figure 1C:
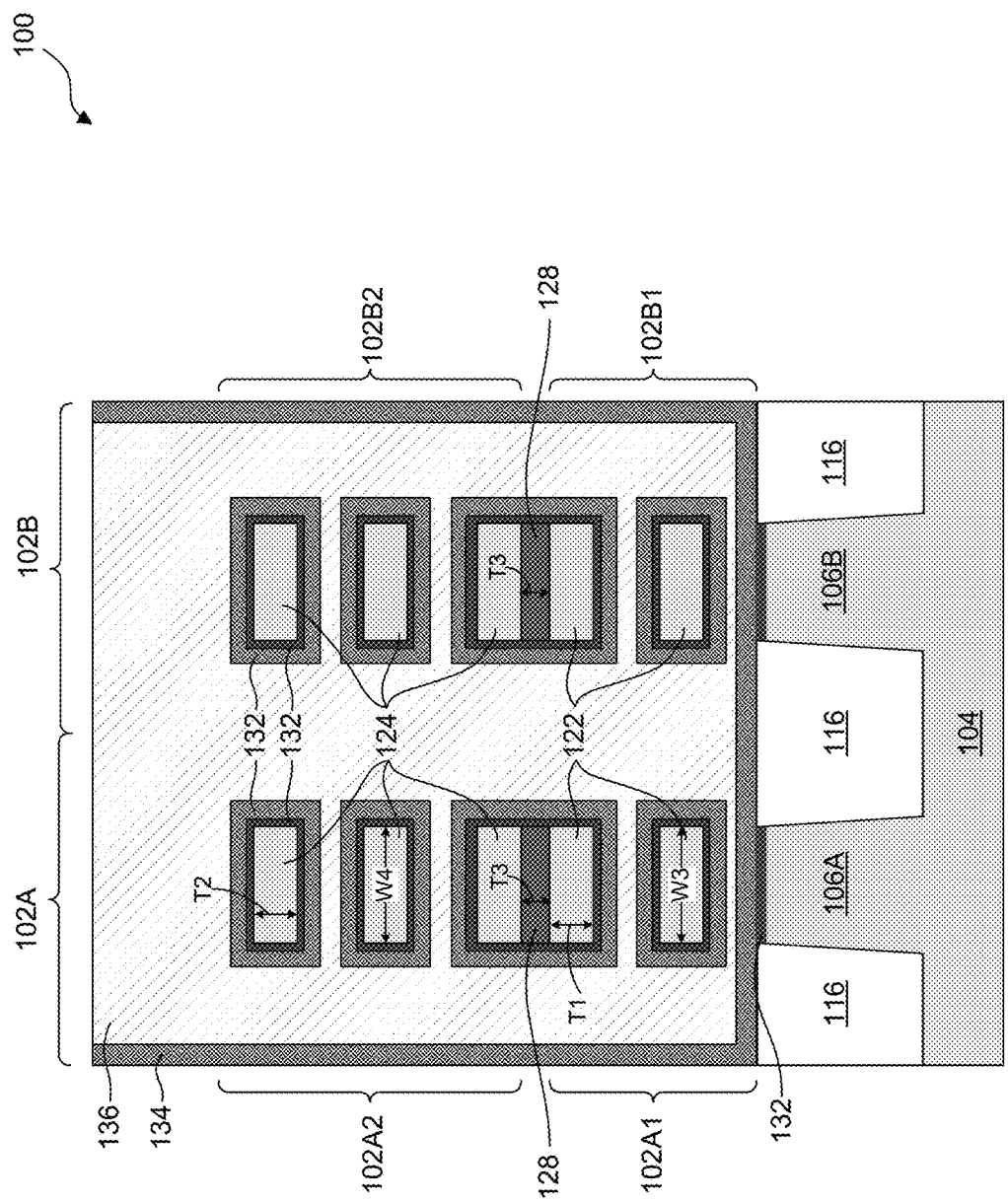
Figure 1F:
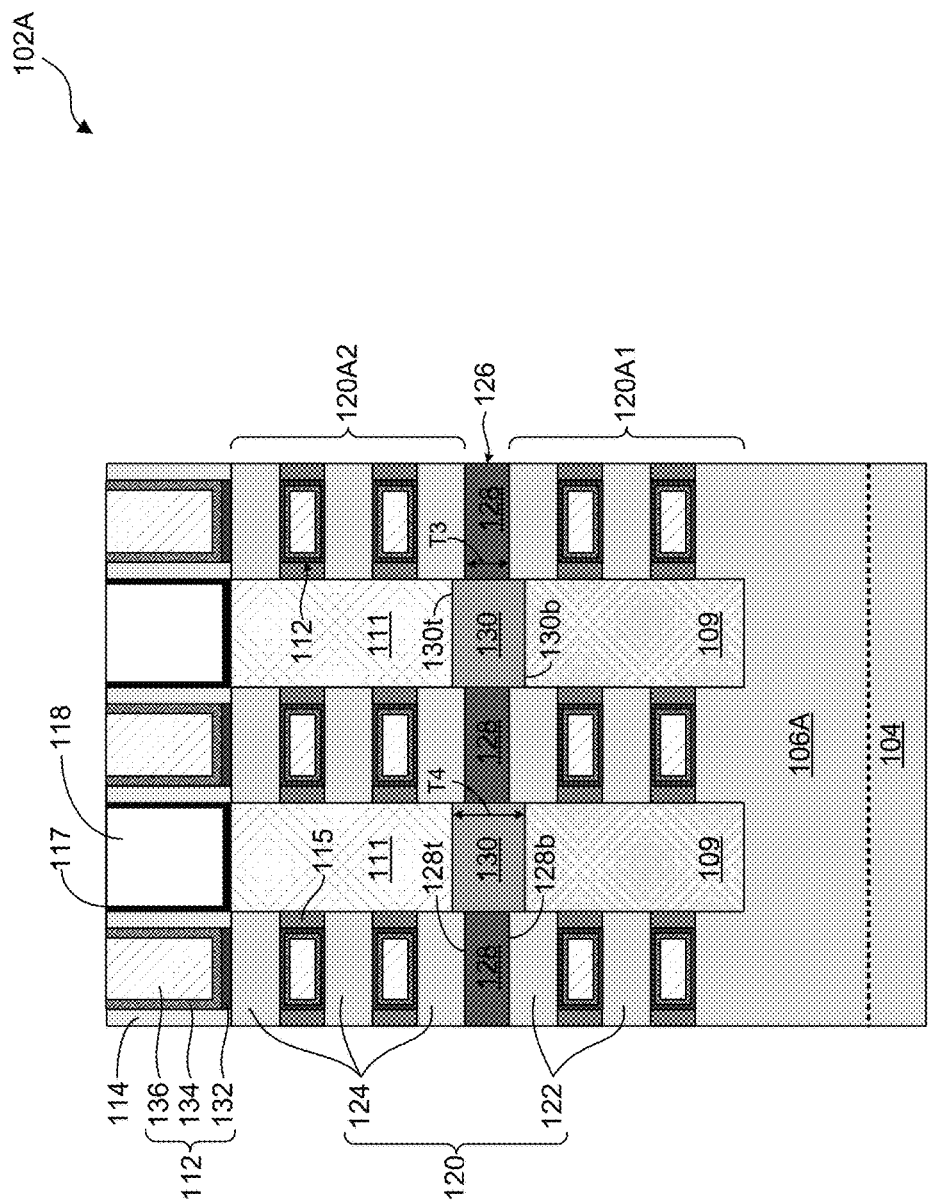
Figure 1G:
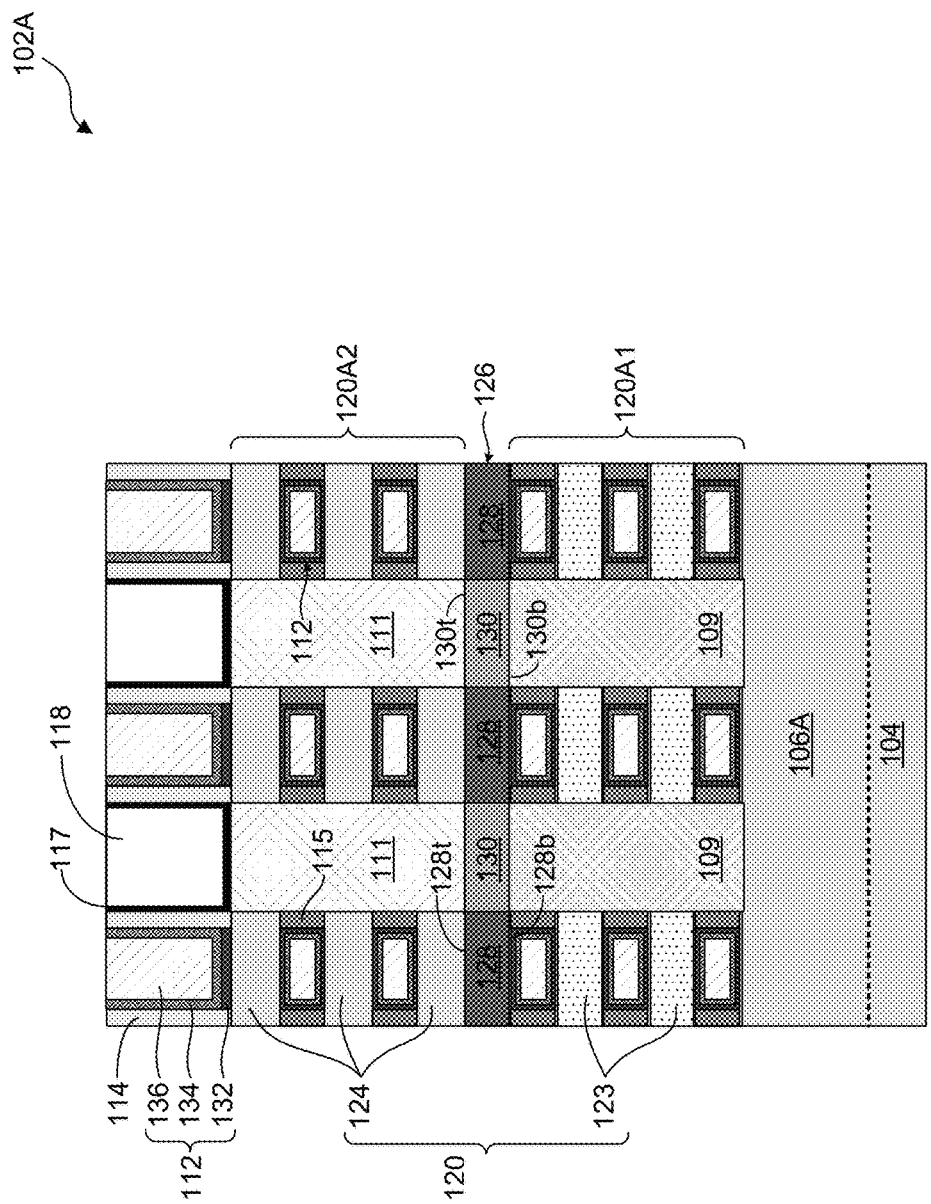

FIG. 1A illustrates an isometric view of a semiconductor device 100 with stacked GAA FETs 102A-102B, according to some embodiments. The discussion of stacked GAA FETs 102A-102B applies to each other, unless mentioned otherwise. FIG. 1B illustrates a cross-sectional view of stacked GAA FET 102A along line A-A of FIG. 1A, according to some embodiments. GAA FET 102B can have a cross-sectional view similar to FIG. 1B along line B-B of FIG. 1A. FIG. 1C illustrates a cross-sectional view of stacked GAA FETs 102A-102B along line C-C of FIG. 1A, according to some embodiments. FIGS. 1D-1E illustrate cross-sectional views of stacked GAA FET 102A along line C-C of FIG. 1A, according to some embodiments. FIGS. 1F-1G illustrate cross-sectional views of GAA FET 102A along line A-A of FIG. 1A, according to some embodiments. FIGS. 1B-1G illustrate cross-sectional views of semiconductor device 100 with additional structures that are not shown in FIG. 1A for simplicity. The discussion of the cross-sectional views of stacked GAA FET 102A in FIGS. 1B-1G applies to stacked GAA FET 102B, unless mentioned otherwise. The discussion of elements with the same annotations applies to each other, unless mentioned otherwise.

Referring to FIG. 1A, semiconductor device 100 can include a substrate 104, an fin structures 106A-106B disposed on substrate 104, an array of gate structures 112 disposed on fin structures 106A-106B, and an array of stacked S/D regions 110 disposed on portions of fin structures 106A-106B that are not covered by gate structures 112. Semiconductor device 100 can further include gate spacers 114, STI regions 116, etch stop layers (ESL) 117, and interlayer dielectric (ILD) layer 118. In some embodiments, gate spacers 114, STI regions 116, ESL 117, and ILD layer 118 can include an insulating material, such as silicon oxide, silicon nitride (SiN), silicon carbon nitride (SiCN), silicon oxycarbon nitride (SiOCN), and silicon germanium oxide. In some embodiments, structures on fin structure 106A can represent stacked GAA FET 102A, and structures on fin structure 106B can represent stacked GAA FET 102B. In some embodiments, stacked GAA FETs 102A-102B share the array of gate structures 112.

Semiconductor device 100 can be formed on substrate 104. There may be other devices and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106A-106B can include a material similar to substrate 104 and extend along an X-axis.

Referring to FIGS. 1A-1C, stacked GAA FET 102A can include (i) stacked channel regions 120 disposed on fin structure 106A, (ii) gate structures 112 surrounding stacked channel regions 120, (iii) stacked S/D regions 110 disposed on fin structure 106A and between stacked channel regions 120, and (iv) a FET isolation layer 126 disposed within stacked channel regions 120 and stacked S/D regions 110. In some embodiments, the structures below FET isolation layers 126 can represent GAA FETs 102A1-102B1 and the structures above FET isolation layers 126 can represent GAA FET 102A2-102B2. FET isolation layer 126 of stacked GAA FET 102A can electrically isolate GAA FETs 102A1-102A2 from each other and FET isolation layer 126 of stacked GAA FET 102B can electrically isolate GAA FETs 102B1-102B2 from each other. In some embodiments, GAA FETs 102A1-102B1 have a conductivity type different from that of GAA FETs 102A2-102B2. In some embodiments, GAA FETs 102A1-102B1 can be n-type and GAA FET 102A2-102B2 can be p-type. In some embodiments, GAA FETs 102A1-102B1 can be p-type and GAA FET 102A2-102B2 can be n-type. In some embodiments, GAA FETs 102A1-102B1 have a conductivity type different from each other and GAA FETs 102A2-102B2 have a conductivity type different from each other.

In some embodiments, each of stacked channel regions 120 of stacked GAA FET 102A can include (i) a stack of nanostructured channel regions 122 disposed on fin structure 106A and (ii) a stack of nanostructured channel regions 124 disposed on FET isolation layer 126. Similarly, each of stacked channel regions 120 of GAA FET 102B can include (i) a stack of nanostructured channel regions 122 disposed on fin structure 106B and (ii) a stack of nanostructured channel regions 124 disposed on FET isolation layer 126. FET isolation layers 126 of stacked GAA FETs 102A-102B can electrically isolate the stacks of nanostructured channel regions 122 from the overlying stacks of nanostructured channel regions 124. Stacked GAA FETs 102A-102B can include any number of nanostructured channel regions in each stack. As used herein, the term "nanostructured" refers to a structure, layer, and/or region having a horizontal dimension (e.g., along an X- and/or Y-axis) and/or a vertical dimension (e.g., along a Z-axis) less than about 100 nm; for example, less than about 90 nm, about 50 nm, about 10 nm, or other values less than about 100 nm.

Nanostructured channel regions 122-124 can include semiconductor materials similar to or different from substrate 104 and can include semiconductor material similar to or different from each other. In some embodiments, nanostructured channel regions 122-124 can include Si, silicon arsenic (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. In some embodiments, nanostructured channel regions 122 have dopants of a conductivity type different from that of nanostructured channel regions 124. In some embodiments, nanostructured channel regions 122 can have n-type dopants (e.g., phosphorus) or p-type dopants (e.g., boron) when nanostructured channel regions 124 have p-type dopants or n-type dopants, respectively. Though rectangular cross-sections of nanostructured channel regions 122-124 are shown, nanostructured channel regions 122-124 can have cross-sections of other geometric shapes (e.g., circular, elliptical, triangular, or polygonal). In some embodiments, nanostructured channel region 122-124 can have thicknesses T1-T2, widths W1-W2 along an X-axis (shown in FIG. 1B), and widths W3-W4 along a Y-axis (shown in FIG. 1C). In some embodiments, a ratio between thickness T1 and width W3 (T1:W3) and/or between thickness T2 and width W4 (T2:W4) can range from about 1:1 to about 1:3 for adequate device performance without compromising the device size. In some embodiments, the dimensions (e.g., thickness T1 and widths W1 and W3) of nanostructured channel regions 122 can be similar to or different from the dimensions (e.g., thickness T2 and widths W2 and W4) of nanostructured channel regions 124 depending on the desired FET characteristics of GAA FETs 102A1 and 102A2.

Referring to FIGS. 1B-1C, in some embodiments, gate structures 112 can be multi-layered structures and can surround nanostructured channel regions 122-124, for which gate structures 122 can be referred to as "GAA structures" or "horizontal GAA (HGAA) structures." Gate portions of gate structures 112 surrounding nanostructured channel regions 122-124 can be electrically isolated from adjacent stacked S/D regions 110 by inner spacers 115. Inner spacers 113 can include an insulating material, such as $SiO_2$, SiN, SiCN, SiOCN, and other suitable insulating materials.

Each of gate structures 112 can include an interfacial oxide (IO) layer 132, a high-k (HK) gate dielectric layer 134 disposed on IO layer 132, and a conductive layer 136 disposed on HK gate dielectric layer 134. IO layers 132 can include silicon oxide ($SiO_2$), silicon germanium oxide ($SiGeO_x$), or germanium oxide ($GeO_x$). HK gate dielectric layers 134 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). Conductive layers 136 can be multi-layered structures. The different layers of conductive layers 136 are not shown for simplicity. Each of conductive layers 136 can include a WFM layer disposed on HK dielectric layer 134, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. In some embodiments, the WFM layers can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1A-1C, each of stacked S/D regions 110 of stacked GAA FET 102A can include a S/D region 109 with a first conductivity type disposed on fin structure 106A and a S/D region 111 with a second conductivity type, which is different from the first conductivity type disposed on FET isolation layer 126. Similarly, each of stacked S/D regions 110 of stacked GAA FET 102B can include S/D region 109 disposed on fin structure 106B and S/D region 111 disposed on FET isolation layer 126. FET isolation layers 126 of stacked GAA FETs 102A-102B can electrically isolate S/D regions 109 from S/D regions 111. In some embodiments, the first conductivity type S/D regions 109 can have n-type dopants (e.g., phosphorus) or p-type dopants (e.g., boron) when the second conductivity type S/D regions 111 have p-type dopants or n-type dopants, respectively. Each of S/D regions 109 and 111 can include an epitaxially-grown semiconductor material, such as Si, Ge, SiGe, germanium stannum (GeSn), and other suitable semiconductor materials.

In some embodiments, each of FET isolation layers 126 can include channel isolation layers 128 and S/D isolation layers 130 arranged in an alternating configuration. Channel isolation layers 128 are disposed between nanostructured channel regions 122 and 124 and S/D isolation layers 130 are disposed between S/D regions 109 and 111. Channel isolation layers 128 can electrically isolate nanostructured channel regions 122 from the overlaying nanostructured channel regions 124. S/D isolation layers 130 can electrically isolate S/D regions 109 from the overlying S/D regions 111.

In some embodiments, channel isolation layers 128 and S/D isolation layers 130 can include the same dielectric material or a dielectric material different from each other. In some embodiments, the dielectric material can include a material with a dielectric constant ranging from about 3 to about 25. In some embodiments, the dielectric material can include $SiO_2$, SiN, silicon oxynitride ($SiO_xN_y$), silicon oxycarbon nitride ($SiO_xC_yN_z$), $HfO_2$, $ZrO_2$, or a combination thereof. In some embodiments, the dielectric material can include a material with a dielectric constant lower than the dielectric constant of $SiO_2$ (about 3.9), such as hydrogenated carbon-doped silicon oxide (SiCOH) (dielectric constant ranging from about 2.7 to about 3.3), fluorosilicate glass (FSG) (dielectric constant about 3.5 to about 3.9), nanopore carbon doped oxide (CDO), black diamond (BD), a benzo-cyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, and combinations thereof.

In some embodiments, thickness T3 of channel isolation layers 128 can range from about 10 nm to about 30 nm for adequate electrical isolation between nanostructured channel regions 122 and 124. In some embodiments, thickness T4 of S/D isolation layers 130 can range from about 10 nm to about 30 nm for adequate electrical isolation between S/D regions 109 and 111. Thicknesses T3-T4 can be the same, as shown in FIG. 1B or can be different from each other, as shown in FIG. 1F. The ratio (T3:T4) between thicknesses T3 and T4 can range from about 1:1 to about 1:2. In some embodiments, thicknesses T3-T4 can be equal to or greater than thicknesses T1-T2 of nanostructured channel regions 122-124. The ratio (T1:T3) between thicknesses T1 and T3 can range from about 1:2 to about 1:4. The ratio (T1:T4) between thicknesses T1 and T4 can range from about 1:2 to about 1:5. Within these ranges of relative dimensions of T1-T4, adequate electrical isolation can be provided by channel isolation layers 128 and S/D isolation layers 130 without compromising the device size and manufacturing cost.

In some embodiments, top surfaces 128t and bottom surfaces 128b of channel isolation layers 128 can be substantially coplanar with respective top surfaces 130t and bottom surfaces 130b of S/D isolation layers 130, as shown in FIG. 1B. In some embodiments, top surfaces 128t and bottom surfaces 128b can be non-coplanar with respective top surfaces 130t and bottom surfaces 130b of S/D isolation layers 130, as shown in FIG. 1F. In some embodiments, top surfaces 128t-130t can be substantially coplanar with each other and bottom surfaces 128b-130b can be non-coplanar with each other or top surfaces 128t-130t can be non-coplanar with each other and bottom surfaces 128b-130b can be substantially coplanar with each other. The non-coplanarity between top surfaces 128t-130t and between bottom surfaces 128b-130b can be a result of fabrication process conditions (e.g., deposition parameters, etching parameters) and/or can be due to the difference between the materials of channel isolation layers 128 and S/D isolation layers 130.

In some embodiments, the dimensions of channel isolation layers 128 along an X-axis can be similar to widths W1-W2, along an X-axis, of nanostructured channel regions 122-124, as shown in FIG. 1B, and/or the dimensions of channel isolation layers 128 along a Y-axis can be similar to widths W3-W4, along a Y-axis, of nanostructured channel regions 122-124, as shown in FIG. 1C. In some embodiments, the dimensions of channel isolation layers 128 along a Y-axis can be different from widths W3-W4 of nanostructured channel regions 122-124 due to non-linear side profiles of channel isolation layers 128, as shown in FIGS. 1D-1E. Structures surrounding nanostructured channel regions 122-124 and channel isolation layers 128 are not shown in FIGS. 1D-1E for simplicity.

Referring to FIG. 1D, in some embodiments, channel isolation layers 128 can have side surfaces 128s with faceted side profiles. The faceted profiles can have facet angles A and B equal to or different from each other and can range from about 120 to about 150 degrees. In some embodiments, channel isolation layers 128 with faceted side surfaces 128s can have bottom surfaces 128b with widths W5 equal to or greater than widths W6 of top surfaces 128t. The ratio (W6:W5) between widths W6 and W5 can range from about 1:1 to about 1:1.2.

Referring to FIG. 1E, in some embodiments, channel isolation layers 128 can have side surfaces 128p with tapered side profiles. The tapered profiles can form angles C and D with bottom surfaces 128b. Angles C and D can be equal to or different from each other and can range from about 60 to about 85 degrees. In some embodiments, channel isolation layers 128 with tapered side surfaces 128p can have bottom surfaces 128b with widths W7 greater than widths W8 of top surfaces 128t. The ratio (W8:W7) between widths W8 and W7 can range from about 1:1 to about 1:1.2.

Referring to FIGS. 1D-1E, in some embodiments, nanostructured channel regions 122-124 can have side surfaces 122s-124s with curved profiles instead of linear profiles shown in FIGS. 1B-1C. The different side profiles of nanostructured channel regions 122-124 and channel isolation layers 128 can be a result of the device fabrication process (e.g., etching process), which is described in detail below.

Referring to FIG. 1G, in some embodiments, stacked channel regions 120 can include stacks of nanostructured channel regions 123 disposed on fin structure 106A-106B instead of stacks of nanostructured channel regions 122. Nanostructured channel regions 123 can include SiGe with p-type dopants and nanostructured channel regions 124 can include Si with n-type dopants.

Figure 1H:
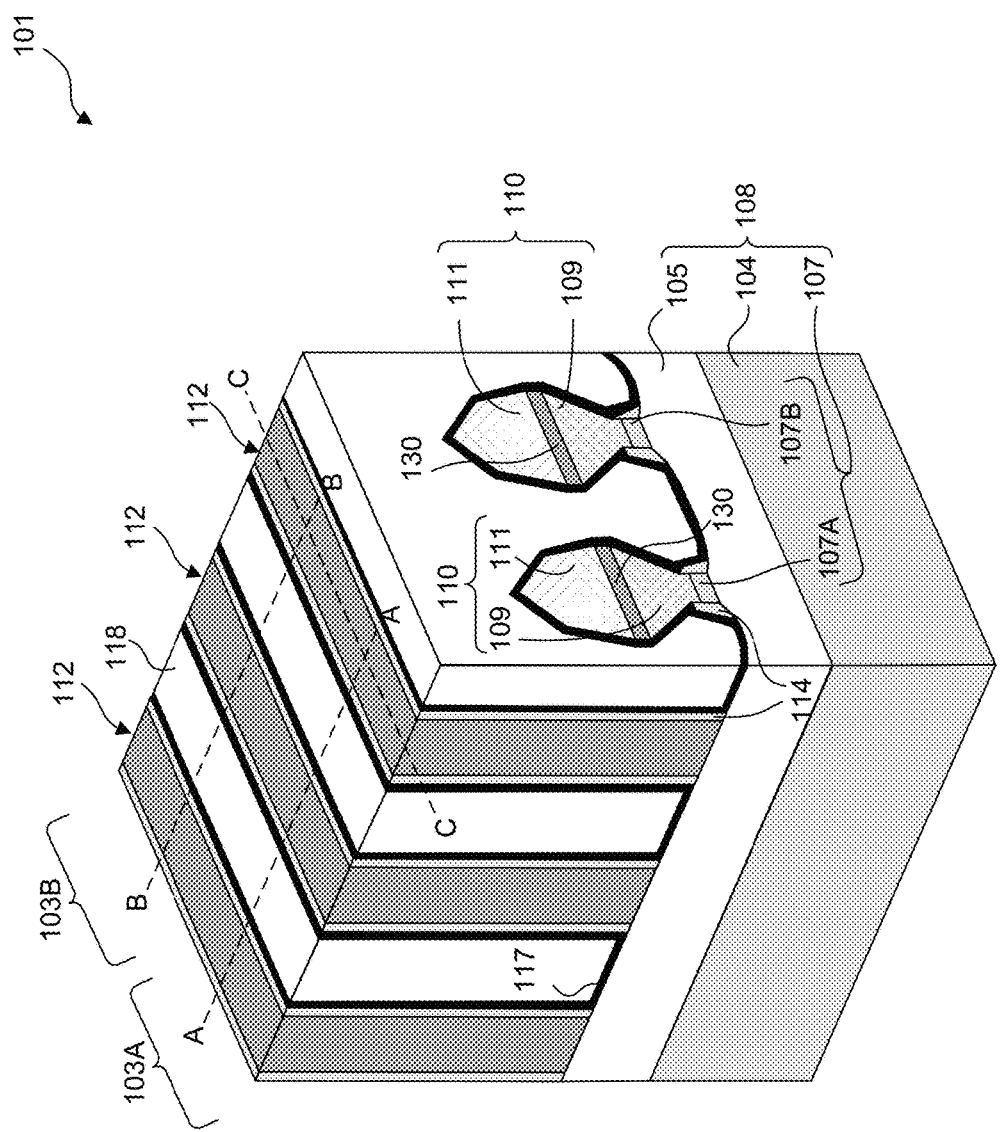
Figure 1I:
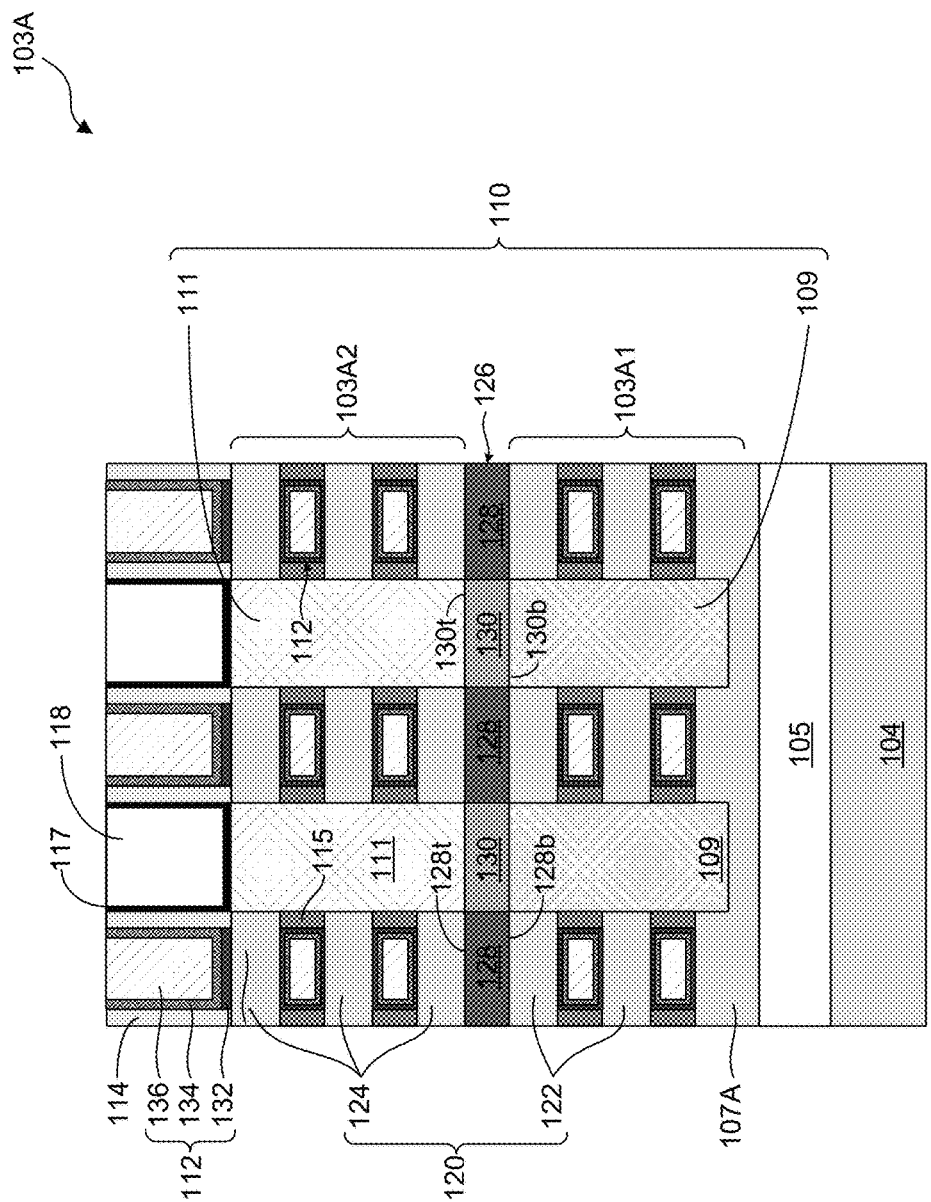
Figure 1J:
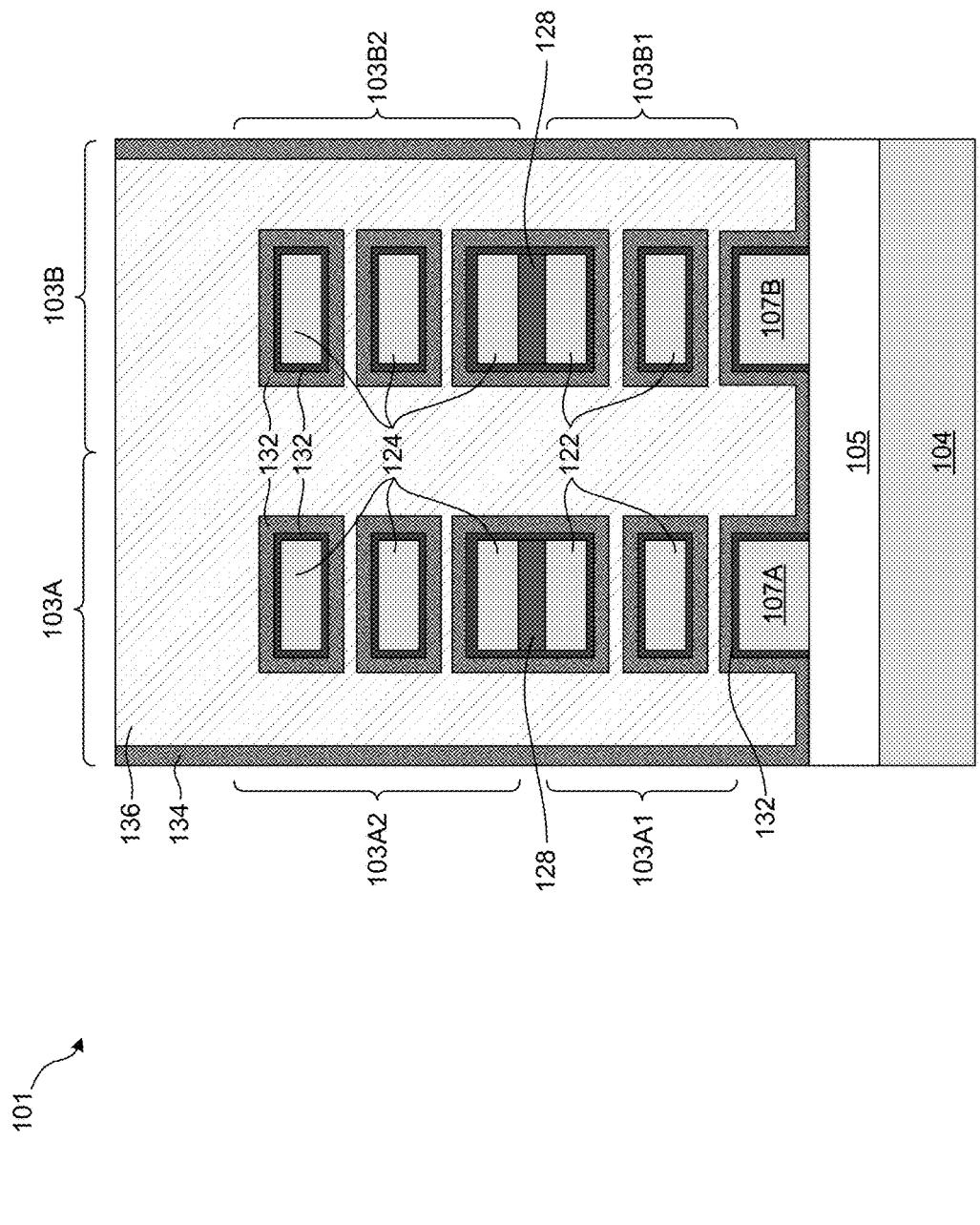

FIG. 1H illustrates an isometric view of a semiconductor device 101 with stacked GAA FETs 103A-103B, according to some embodiments. FIG. 1I illustrates a cross-sectional view of stacked GAA FET 103A along line A-A of FIG. 1H, according to some embodiments. GAA FET 103B can have a cross-sectional view similar to FIG. 1I along line B-B of FIG. 1H. FIG. 1J illustrates a cross-sectional view of stacked GAA FETs 103A-103B along line C-C of FIG. 1H, according to some embodiments. FIGS. 1I-1J illustrate cross-sectional views of semiconductor device 101 with additional structures that are not shown in FIG. 1H for simplicity. The discussion of the cross-sectional views of stacked GAA FET 103A in FIG. 1I applies to stacked GAA FET 103B, unless mentioned otherwise. The discussion of elements with the same annotations applies to each other, unless mentioned otherwise.

The discussion of semiconductor device 100 applies to semiconductor device 101, unless mentioned otherwise. The discussion of stacked GAA FETs 102A-102B applies to stacked GAA FETs 103A-103B, respectively, unless mentioned otherwise.

Referring to FIGS. 1H-1J, semiconductor device 101 can be formed on an SOI substrate 108, which includes substrate 104, an oxide layer 105 disposed on substrate 104, and Si layer 107 disposed on oxide layer 105. The formation of semiconductor device 101 on SOI substrate 108 can eliminate the need for electrical isolation with STI regions 116 (shown in FIGS. 1A-1C and 1F-1G) as used in semiconductor device 100. Oxide layer 105 of SOI substrate 108 can electrically isolate stacked GAA FETs 103A-103B from each other and from adjacent devices. As a result, the formation of semiconductor device 101 on SOI substrate 108 can simplify the device fabrication process and reduce device manufacturing cost by eliminating the fabrication steps for forming STI regions 116. In some embodiments, oxide layer 105 can have a thickness ranging from about 100 nm to about 3000 nm for providing adequate electrical isolation between devices.

Semiconductor device 101 can include fin structures 107A-107B formed from Si layer 107 (described in detail below), instead of from substrate 104, as shown in FIGS. 1A-1C and 1F-1G. Semiconductor device 101 further includes array of gate structures 112 disposed on fin structures 107A-107B and array of stacked S/D regions 110 disposed on portions of fin structures 107A-107B that are not covered by gate structures 112.

Referring to FIGS. 1I-1J, stacked GAA FET 103A can include (i) stacked channel regions 120 disposed on fin structure 107A, (ii) gate structures 112 surrounding stacked channel regions 120, (iii) stacked S/D regions 110 disposed on fin structure 107A and between stacked channel regions 120, and (iv) FET isolation layer 126 disposed within stacked channel regions 120 and stacked S/D regions 110. In some embodiments, the structures below FET isolation layers 126 can represent GAA FETs 103A1-103B1 and the structures above FET isolation layers 126 can represent GAA FET 103A2-103B2. The discussion of GAA FETs 102A1-102A2 and 102B1-102B2 applies to GAA FETs 103A1-103A2 and 103B1-103B2, unless mentioned otherwise.

Figure 2:
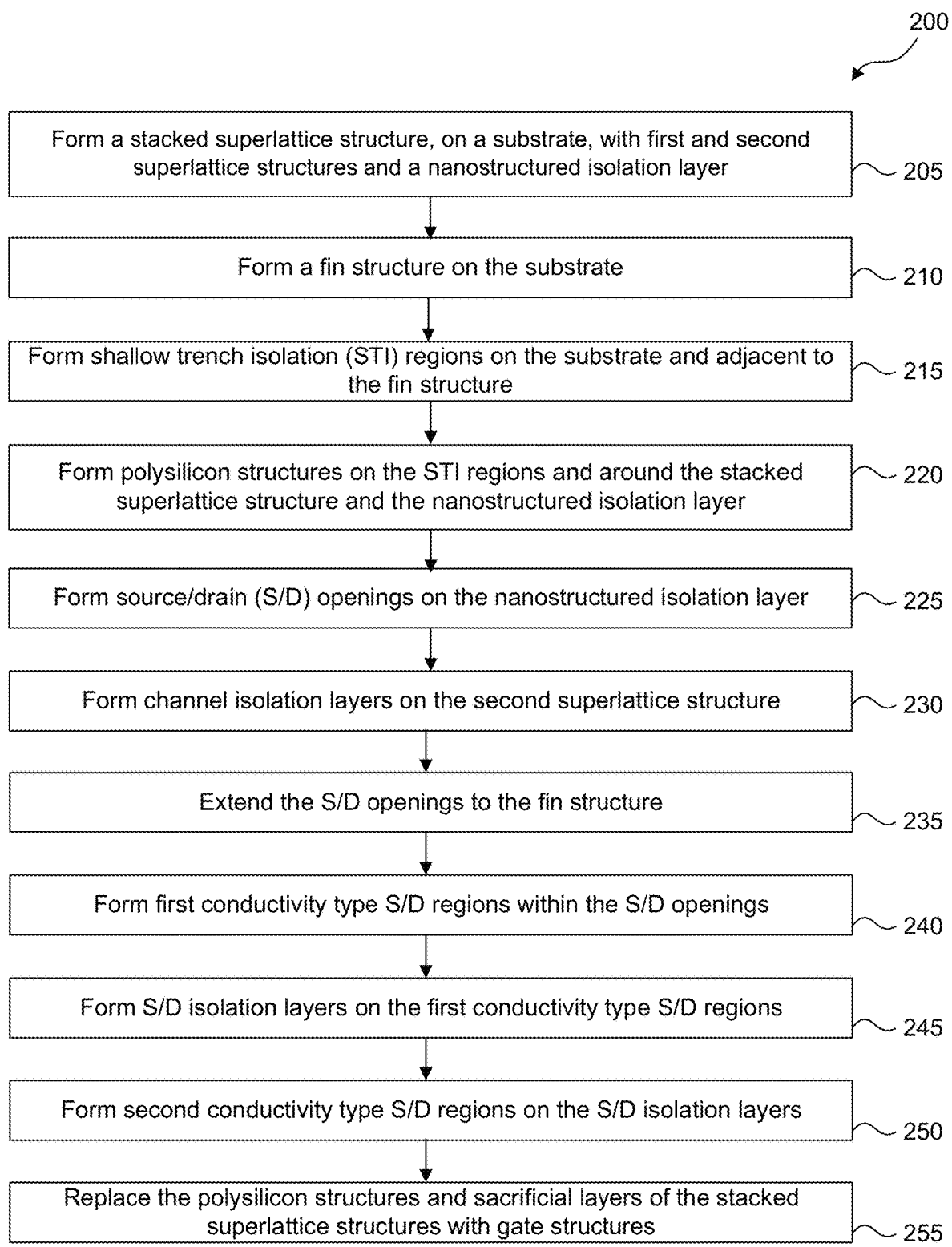
FIG. 2 is a flow diagram of a method for fabricating a semiconductor device with stacked FETs, in accordance with some embodiments.

FIG. 2 is a flow diagram of an example method 200 for fabricating semiconductor device 100 with cross-sectional view shown in FIGS. 1B-1C, according to some embodiments. For illustrative purposes, the operations illustrated in FIG. 2 will be described with reference to the example fabrication process for fabricating stacked GAA 102A of semiconductor device 100 as illustrated in FIGS. 3-31. The discussion of fabricating stacked GAA 102A applies to the operations of fabricating stacked GAA 102B, unless mentioned otherwise. FIGS. 3-8, 12-14, and 17-18 are isometric views of semiconductor device 100 at various stages of fabrication, according to some embodiments. FIGS. 9-11, 15-16, and 19-31 are cross-sectional views of stacked GAA FET 102A along line A-A of FIG. 1A at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3-31 with the same annotations as elements in FIGS. 1A-1G are described above.

In operation 205, a stacked superlattice structure with first and second superlattice structures and a nanostructured isolation layer are formed on a substrate. For example, as described with reference to FIGS. 3-13, a stacked superlattice structure 1341 with a first superlattice structure 839, a second superlattice structure 1337, and a nanostructure isolation layer 1228 are formed on substrate 104.

Figure 3:
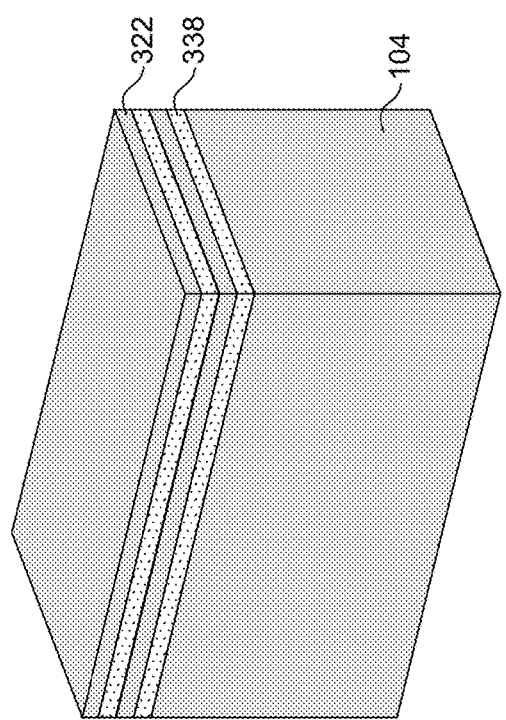
Figure 5:
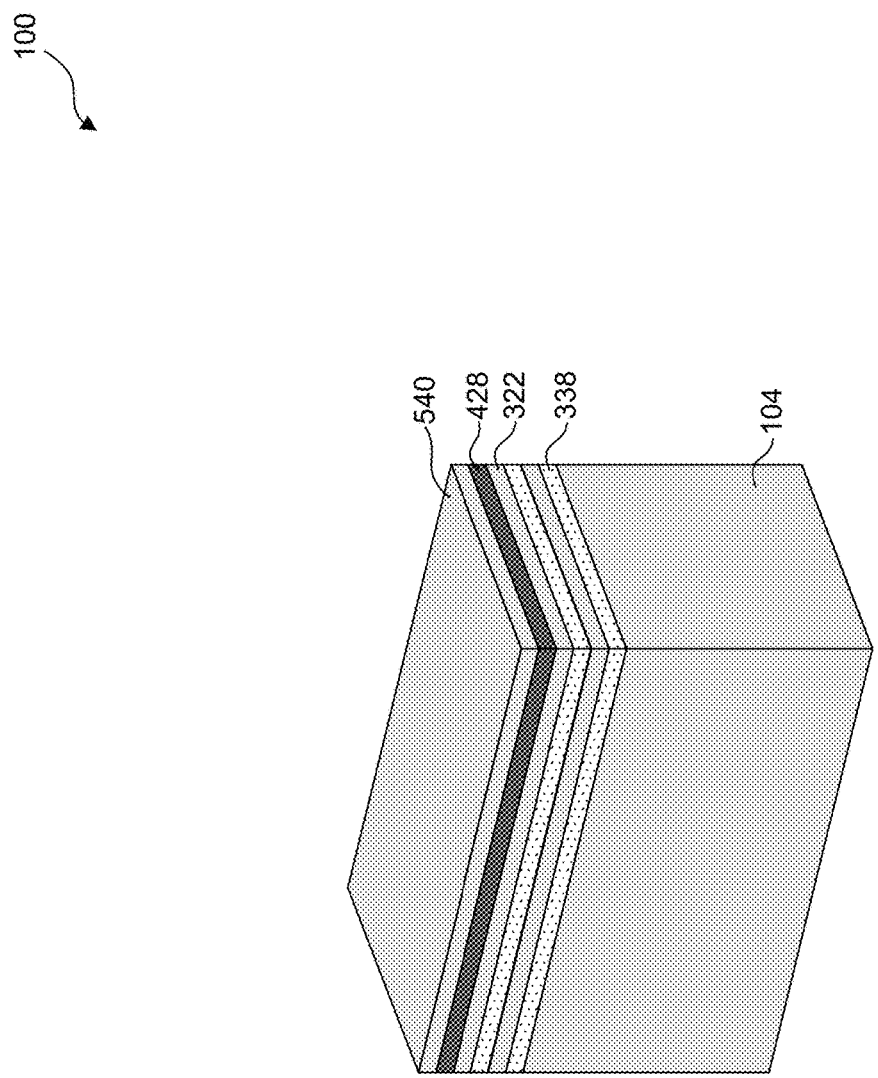
Figure 6:
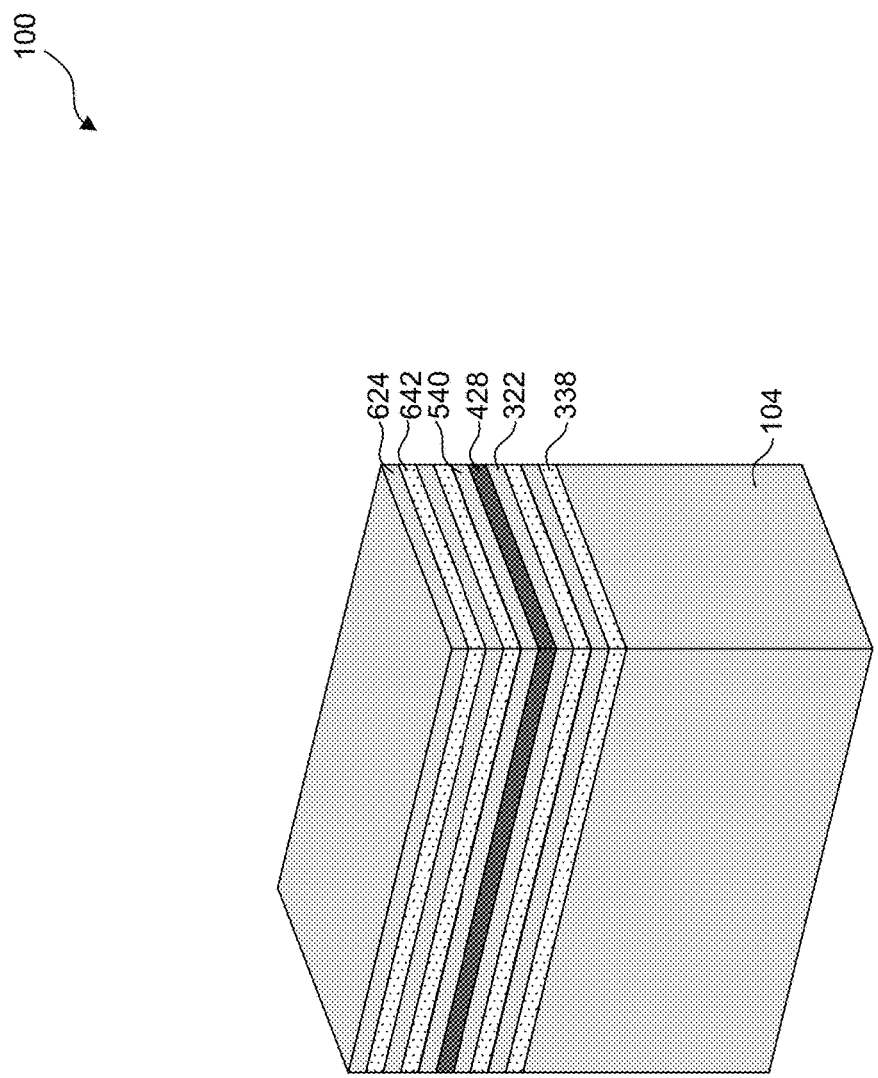
Figure 7:
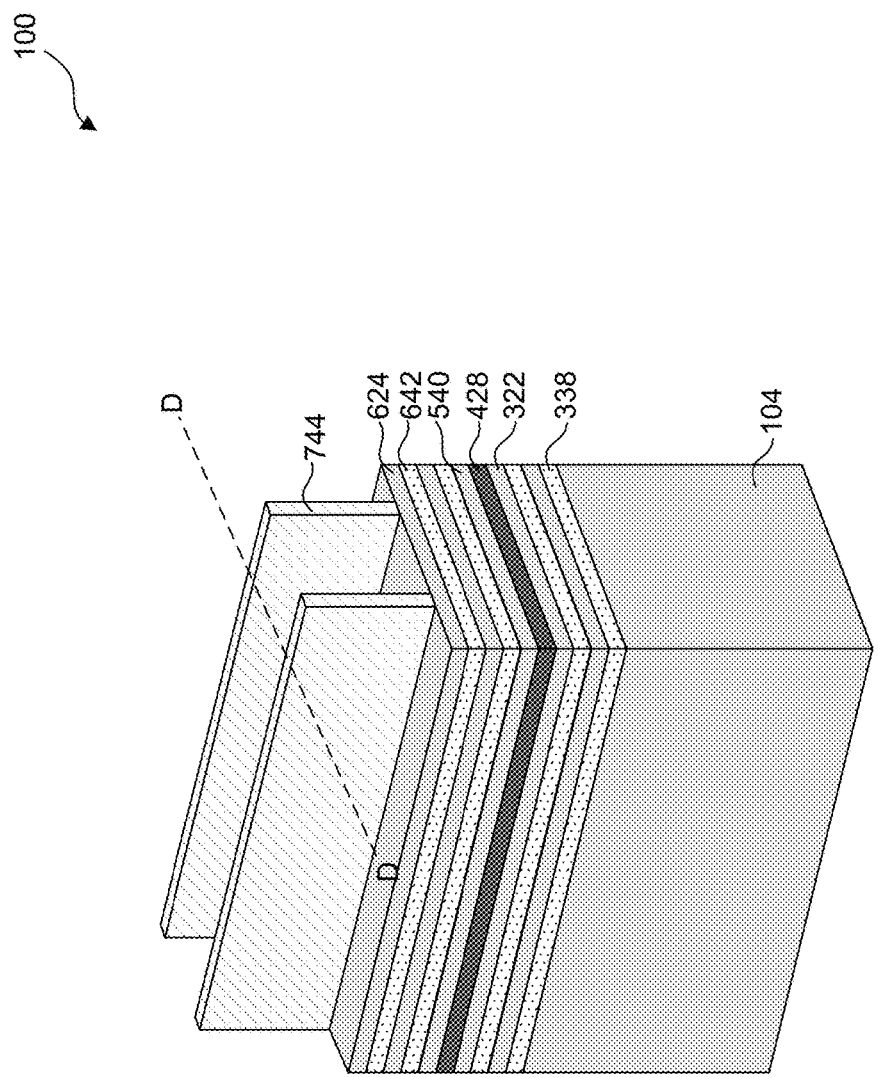
Figure 8:
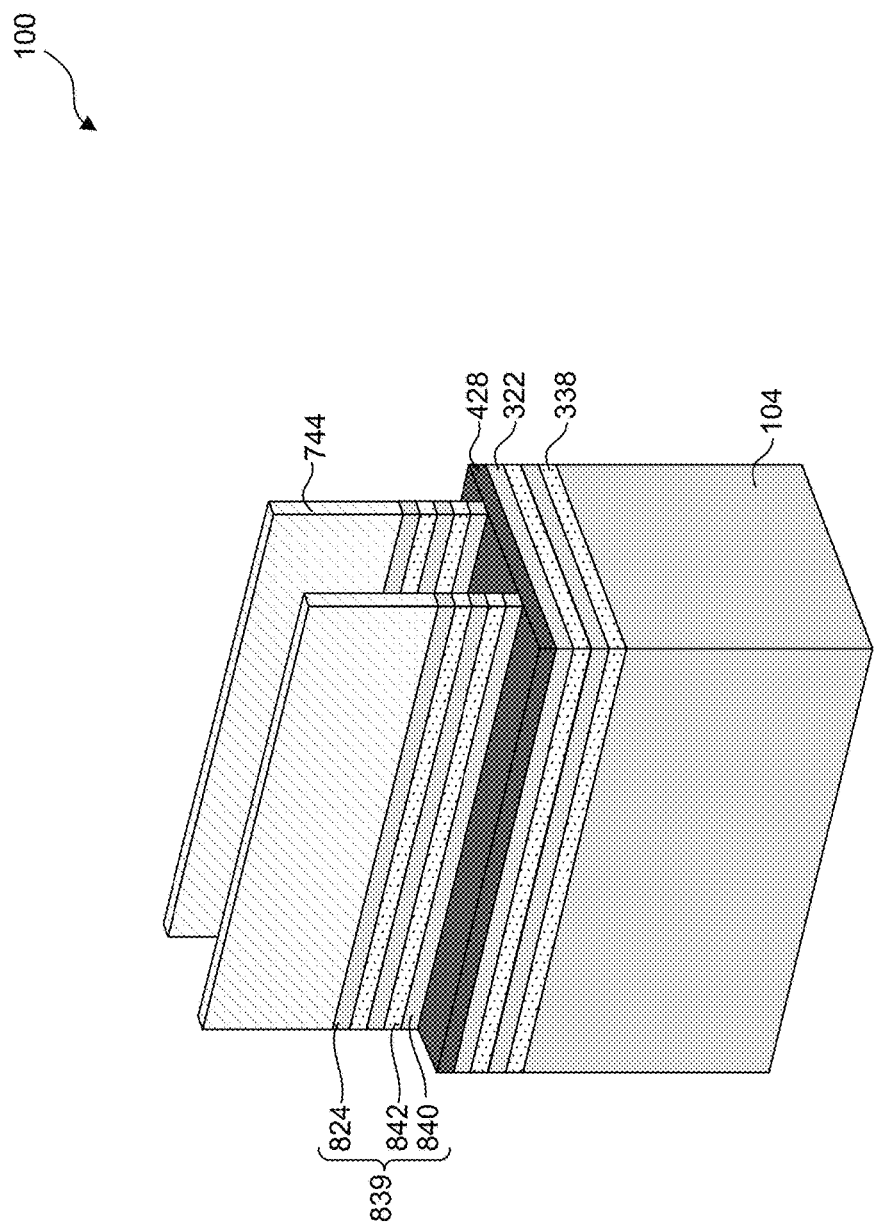
Figure 12:
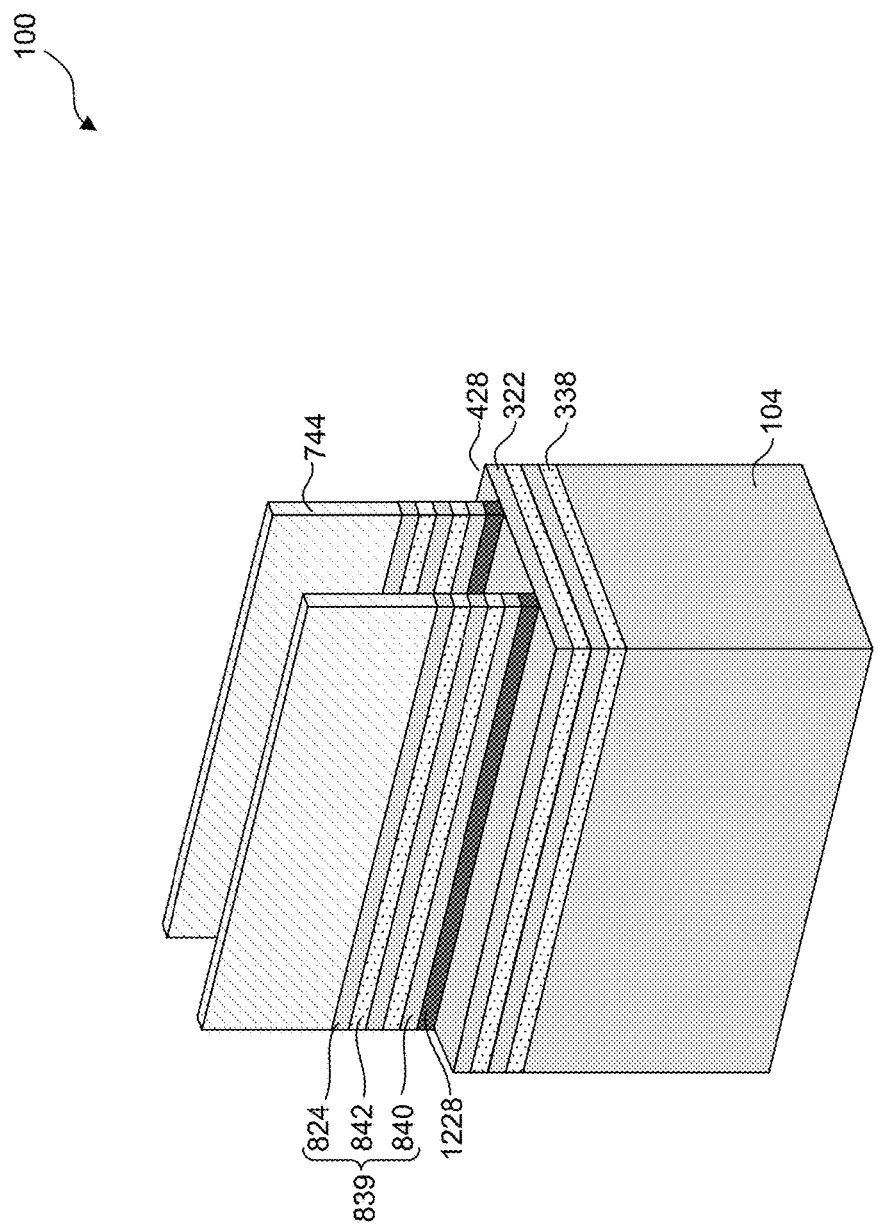
Figure 13:
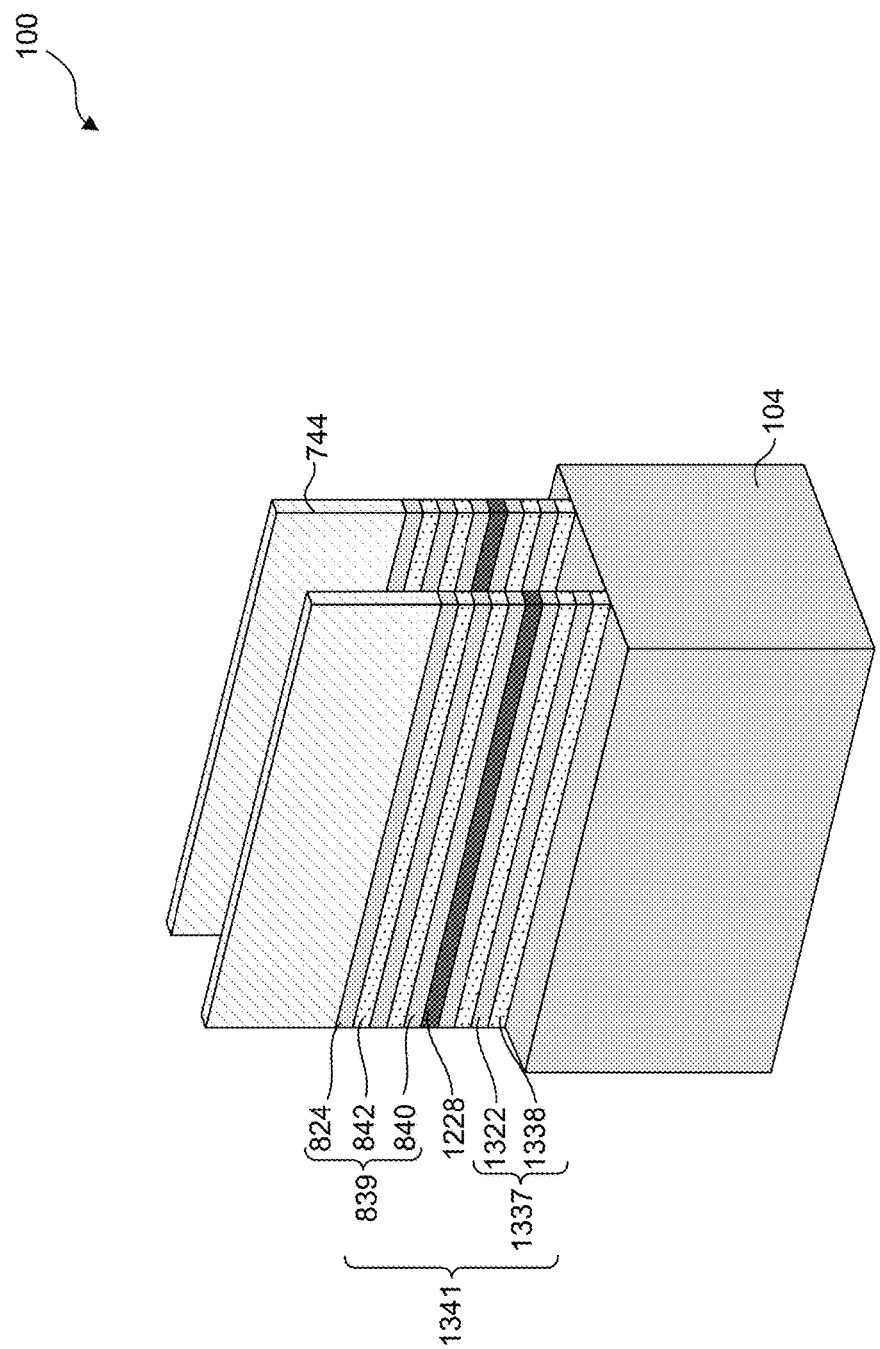

The formation of stacked superlattice structure 1341 can include sequential operations of (i) epitaxially growing a stack of semiconductor layers 322 and 338 in an alternating configuration on substrate 104 to form the structure of FIG. 3, (ii) doping the stack of semiconductor layers 322 and 338 with a first conductivity type dopants (e.g., p-type dopants), (iii) depositing a dielectric layer 428 on the stack of semiconductor layers 322 and 338 to form the structure of FIG. 4, (iv) depositing a Si layer 540 as a seed layer on dielectric layer 428 to form the structure of FIG. 5, (v) epitaxially growing a stack of semiconductor layers 624 and 642 in an alternating configuration on Si layer 540 to form the structure of FIG. 6, (vi) doping the stack of semiconductor layers 624 and 642 with a second conductivity type dopants (e.g., n-type dopants) that is different from the first conductivity type dopant, (vii) forming a patterned masking layer 744 (e.g., SiN, $SiO_2$, SiON, $SiO_xC_yN_z$, silicon carbide (SiC), $HfO_2$, or $ZrO_2$) on the structure of FIG. 6 to form the structure of FIG. 7, (viii) forming first superlattice structure 839 with nanostructured layers 824, 842, and 840 on dielectric layer 428, as shown in FIG. 8, (ix) forming nanostructured isolation layer 1228, as shown in FIG. 12, and (x) forming second superlattice structure 1341 with nanostructured layers 1322 and 1338 on substrate 104, as shown in FIG. 13.

The materials of semiconductor layers 322 and 338 are different from each other. In some embodiments, semiconductor layer 322 can include Si and semiconductor layer 338 can include SiGe. Similarly, the materials of semiconductor layers 624 and 642 are different from each other. In some embodiments, semiconductor layer 624 can include Si and semiconductor layer 642 can include SiGe. Semiconductor layers 322 and 624 can have the same material and can form respective nanostructured channel regions 122 and 124 in subsequent processing. Nanostructured isolation layer 1228 can form channel isolation layers 128 in subsequent processing.

In some embodiments, the formation of first superlattice structure 839 can include etching the portions of layers 624, 642, and 540 from the structure of FIG. 7 that are not underlying patterned masking layer 744. The etching process can include a plasma ash process, a dry etch process, a wet etch process, or other suitable etching process. In some embodiments, the dry etch process can include using etchants with oxygen-containing gas, fluorine-containing gas, such as carbon tetrafluoride ($CF_4$), sulfur hexafluoride ($SF_6$), difluoromethane ($CH_2F_2$), fluoroform ($CHF_3$), and hexafluoroethane ($C_2F_6$), chlorine-containing gas, such as $Cl_2$, chloroform ($CHCl_3$), carbon tetrachloride ($CCl_4$), and boron trichloride ($BCl_3$), and/or bromine-containing gas, such as hydrogen bromide (HBr) and bromoform ($CHBr_3$). In some embodiments, wet etch process can include using etchants with ammonium hydroxide ($NH_4OH$), hydrofluoric acid (HF), deionized water, and/or tetramethylammonium hydroxide (TMAH).

In some embodiments, the etching process can include a three-stage plasma process, as described with reference to FIGS. 9-11. FIGS. 9-11 are cross-sectional views along line D-D of FIG. 7 during the three-stage plasma process. The first stage of the plasma process can include performing a chlorine-based plasma etch on the structure of FIG. 7. The chlorine-based plasma etches the portions of layers 624, 642, and 540 from the structure of FIG. 7 that are not underlying patterned masking layer 744 to form a superlattice structure 939 with tapered sidewalls on dielectric layer 428, as shown in FIG. 9. The chlorine-based plasma etch can include using a gas mixture 945 of chlorine-containing gas (e.g., $Cl_2$, $CHCl_3$, $CCl_4$, and $BCl_3$) and a small concentration of fluorine gas or fluorine-containing gas. The gas concentration ratio between chlorine-containing gas and fluorine-containing gas ($Cl_2:F_2$) in the gas mixture can range from about 10:1 to about 15:1.

The second stage of the plasma process can include performing a fluorine-based plasma etch on the structure of FIG. 9. The fluorine-based plasma etches superlattice structure 939 of FIG. 9 to modify the tapered sidewall profiles to substantially vertical sidewall profiles and form first superlattice structures 839 with substantially vertical sidewalls on dielectric layer 428, as shown in FIG. 10. The fluorine-based plasma etch can include using fluorine-containing gas 1045, such as CF$_4$, SF$_6$, CH$_2$F$_2$, CHF$_3$, and C$_2$F$_6$. The third stage of the plasma process can include performing an oxidation process using oxygen plasma on the structure of FIG. 10 to form a protective oxide layer 1145 on the sidewalls of first superlattice structure 839, as shown in FIG. 11. Protective oxide layer 1145 can protect the sidewalls during subsequent forming of nanostructured isolation layer 1228 and second superlattice structure. In some embodiments, the three stages of the plasma process can be considered as one plasma cycle and the plasma cycle can be repeated two or more times to achieve substantially vertical sidewalls of first superlattice structures 839. In some embodiments, the first stage of the plasma process controls the etching depth and the second stage of the plasma process controls the etching profile of first superlattice structures 839. In some embodiments, additives (e.g., H$_2$, O$_2$, CO$_2$, and SiCl$_4$) and/or carrier gases (e.g., He and Ar) are used in the three stages of the plasma process.

In some embodiments, the formation of nanostructured isolation layer 1228 can include etching the exposed portions of dielectric layer 428 from the structure of FIG. 8 using a dry etch process or a wet etch process. In some embodiments, the formation of second superlattice structure 1337 can include etching the portions of layers 322 and 338 from the structure of FIG. 12 that are not underlying nanostructured isolation layer 1228. The portions of layers 322 and 338 can be etched using the same processes as that used for etching layers 624, 642, and 540 from the structure of FIG. 7 to form first superlattice structure 839.

Figure 14:
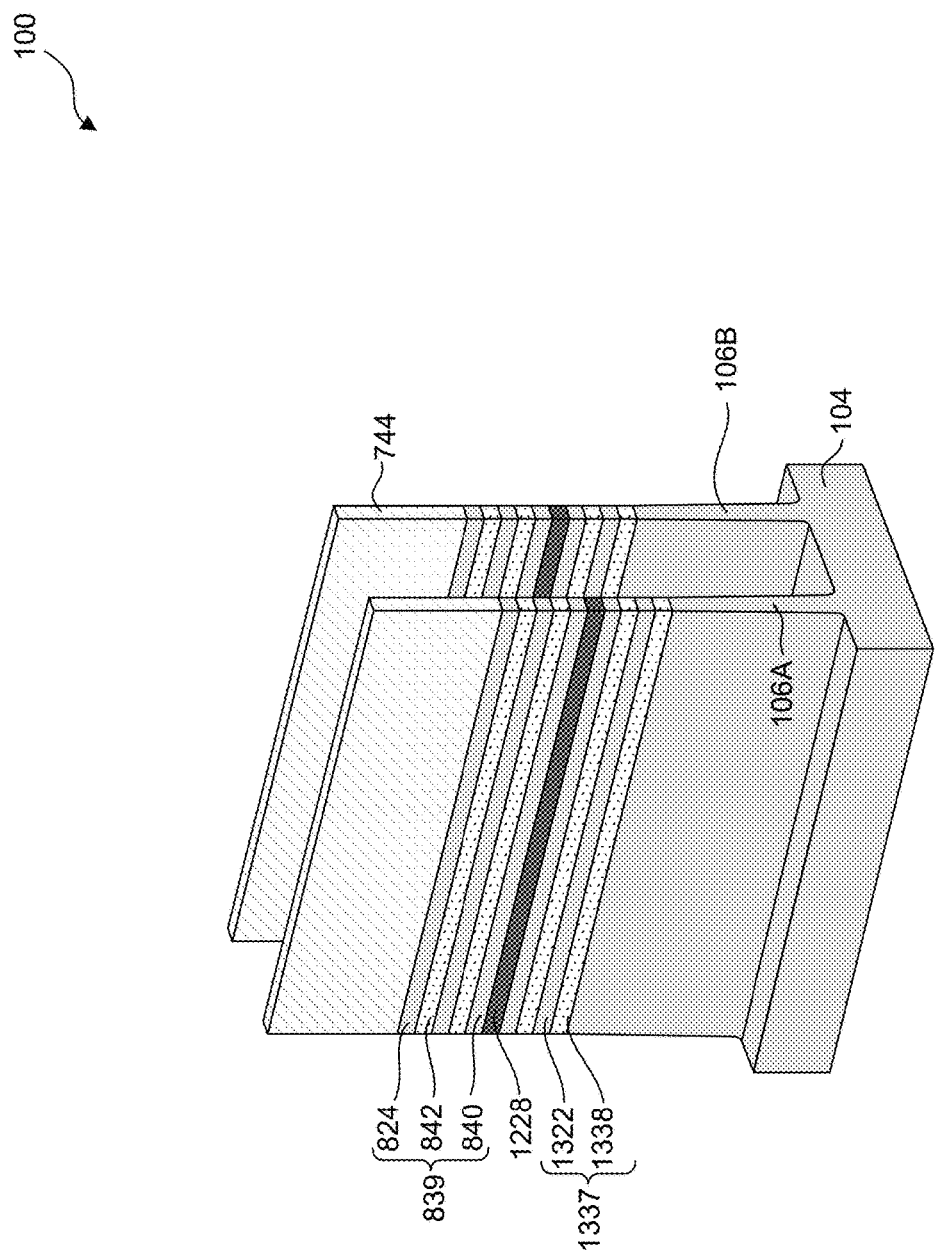

Referring to FIG. 2, in operation 210, a fin structure is formed on the substrate. For example, as shown in FIG. 14, fin structures 106A-106B are formed on substrate 104. In some embodiments, the formation of fin structures 106A-106B can include etching the exposed portions of substrate 104 from the structure of FIG. 13 using a dry etch process or a wet etch process to form the structure of FIG. 14.

In some embodiments, nanostructured layers 824 and 842 of first superlattice structure 839 and nanostructured layers 1322 and 1338 of second superlattice structure 1337 can have side surfaces 824s, 842s, 1322s, and 1338s with curved profiles as shown in FIGS. 15-16. The curved side profiles can be due to the multi-stage and/or multi-cycle plasma process. In some embodiments, referring to FIG. 15, nanostructured isolation layer 1228 can have side surfaces 1228s with faceted side profiles. The faceted profiles can have facet angles A and B equal to or different from each other and can range from about 120 to about 150 degrees. In some embodiments, nanostructured isolation layer 1228 with faceted side surfaces 1228s can have bottom surfaces 1228b with widths W5 equal to or greater than widths W6 of top surfaces 1228t. The ratio (W6:W5) between widths W6 and W5 can range from about 1:1 to about 1:1.2. In some embodiments, referring to FIG. 16, nanostructured isolation layer 1228 can have side surfaces 1228p with tapered side profiles. The tapered profiles can form angles C and D with bottom surfaces 1228b. Angles C and D can be equal to or different from each other and can range from about 60 to about 85 degrees. In some embodiments, nanostructured isolation layer 1228 with tapered side surfaces 1228p can have bottom surfaces 1228b with widths W7 greater than widths W8 of top surfaces 1228t. The ratio (W8:W7) between widths W8 and W7 can range from about 1:1 to about 1:1.2.

Figure 17:
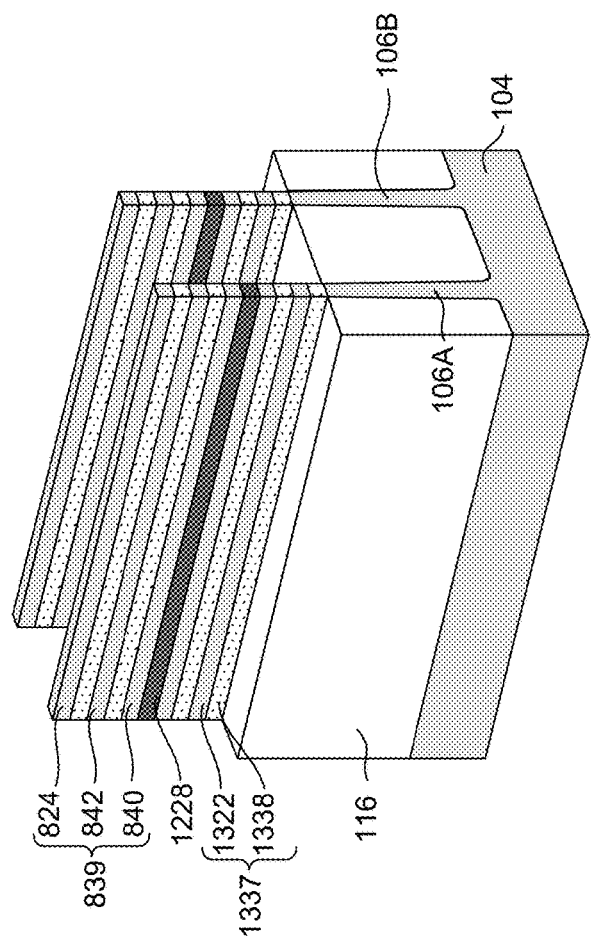

Referring to FIG. 2, in operation 215, STI regions are formed on the substrate and adjacent to the fin structure. For example, as shown in FIG. 17, STI regions 116 are formed on substrate 104 following the formation of fin structures 106A-106B.

Figure 18:
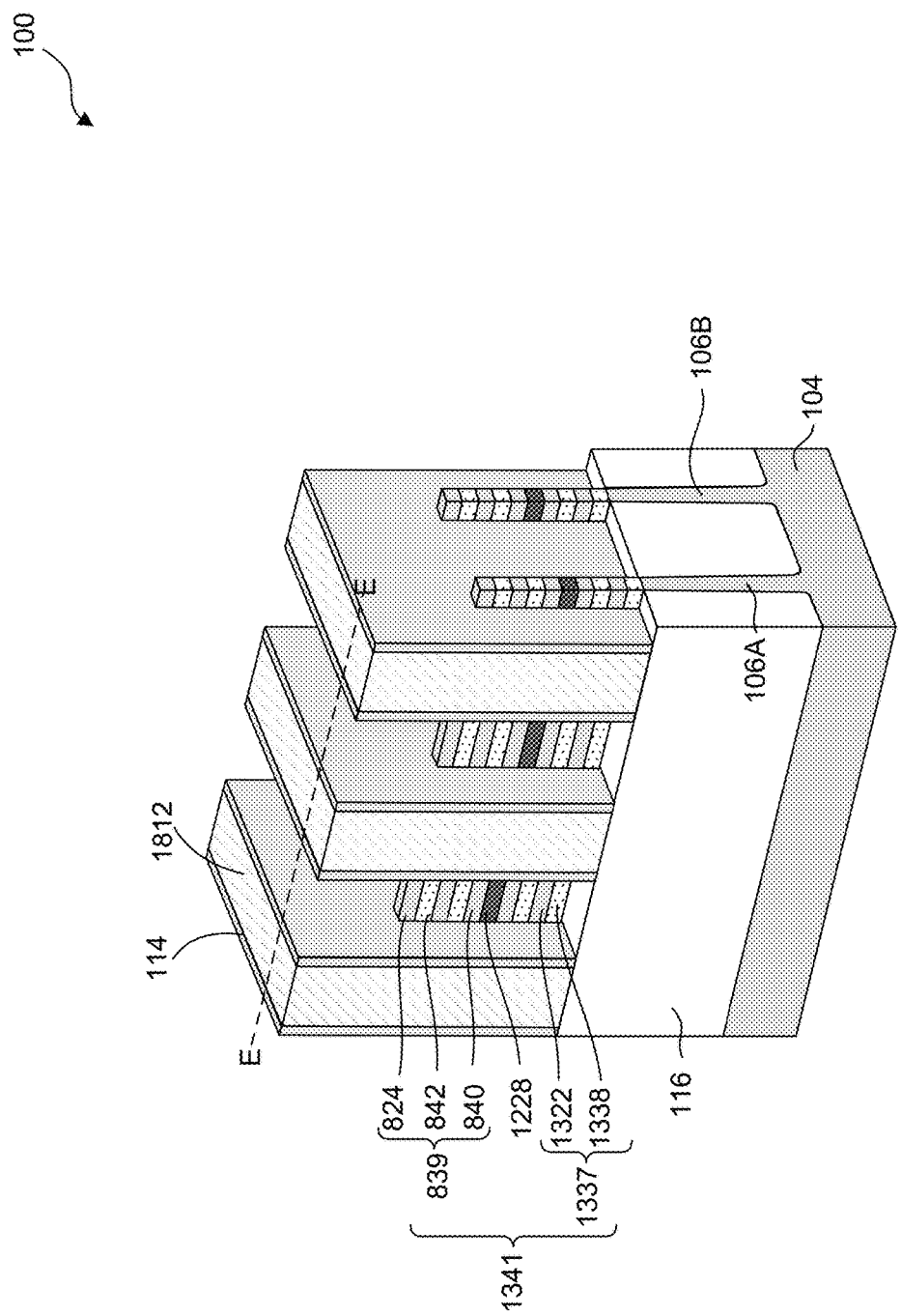
Figure 19:
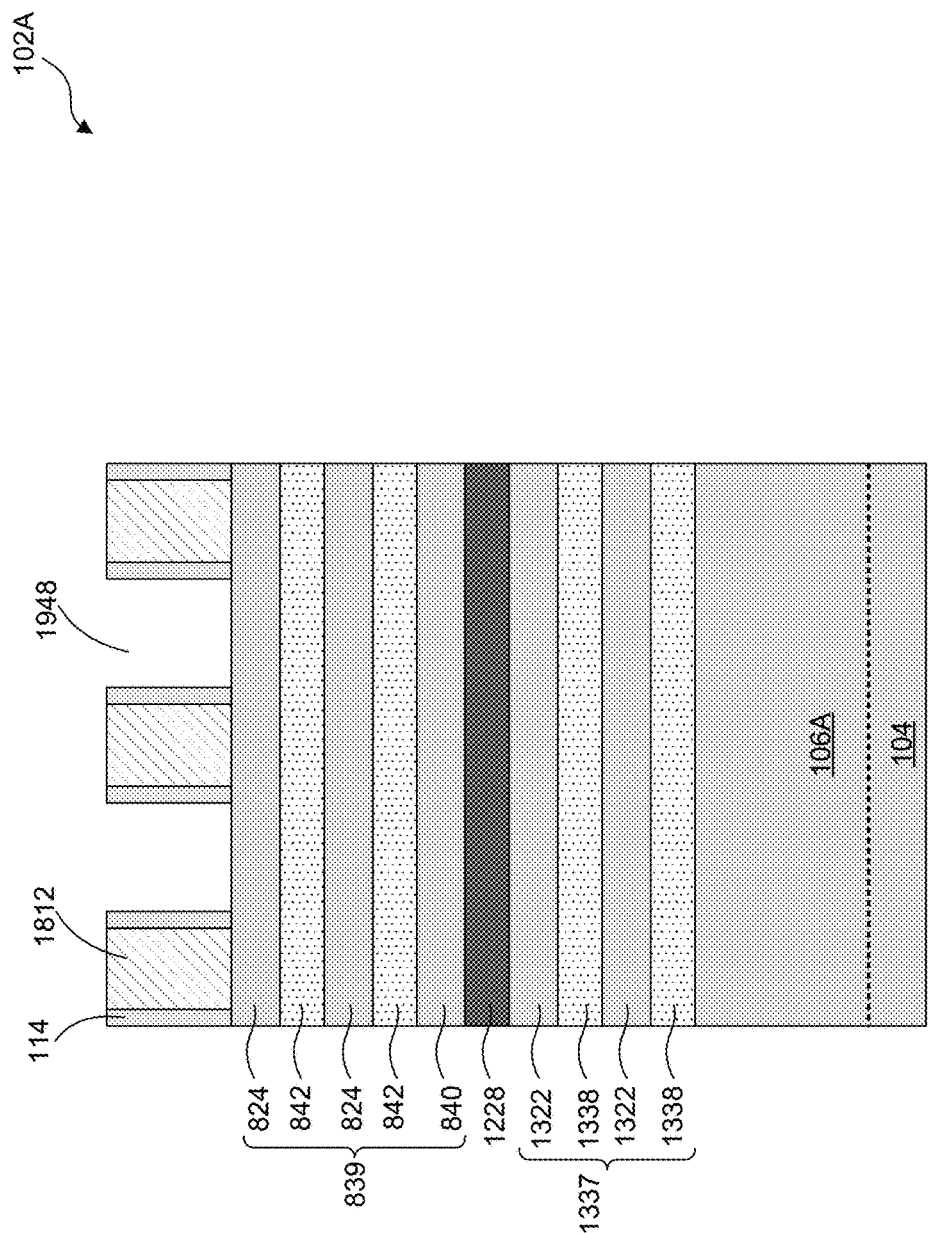

Referring to FIG. 2, in operation 220, polysilicon structures are formed on the STI regions and around the stacked superlattice structure and the nanostructured isolation layer. For example, as shown in FIG. 18, polysilicon structures 1812 are formed on STI regions 116 and around stacked superlattice structure 1341. Following the formation of polysilicon structures 1812, gate spacers 114 are formed on the sidewalls of polysilicon structures 1812, as shown in FIG. 18. FIG. 19 shows a cross-sectional view along line E-E of FIG. 18.

Figure 20:
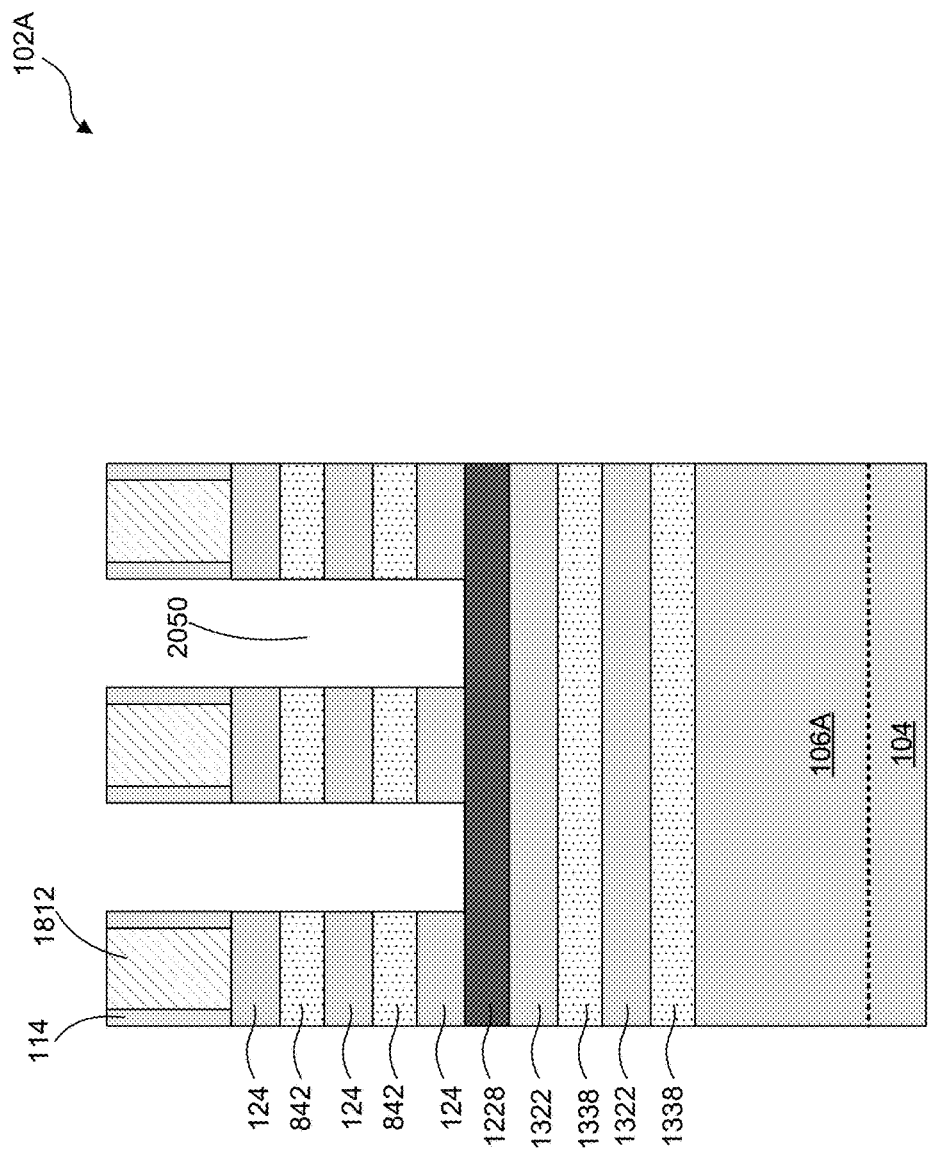

Referring to FIG. 2, in operation 225, S/D openings are formed on the nanostructured isolation layer. For example, as shown in FIG. 20, S/D openings 2050 are formed on nanostructured isolation layer 1228. The formation of S/D openings 2050 can include etching first superlattice structure 839, through openings 1948, from the structure of FIG. 19 to form the structure of FIG. 20. Following the formation of S/D openings 2050, nanostructured channel regions 124 are formed, as shown in FIG. 20. In some embodiments, nanostructured layers 842 are considered sacrificial layers and are replaced with gate structures in subsequent processing.

Figure 21:
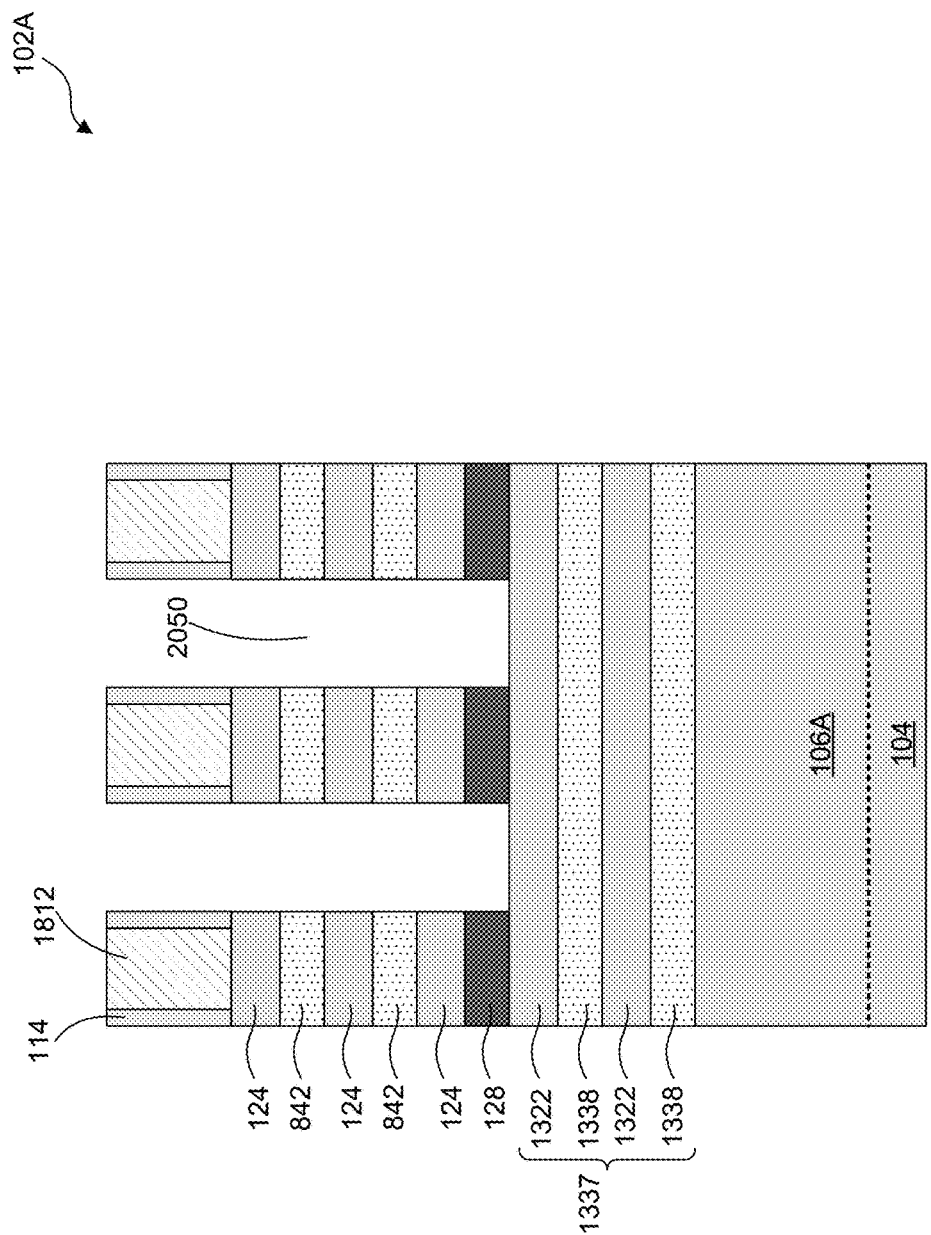

Referring to FIG. 2, in operation 230, channel isolation layers are formed on the second superlattice structure. For example, as shown in FIG. 21, channel isolation layers 128 are formed on second superlattice structure 1337. The formation of channel isolation layers 128 can include etching the exposed portions of nanostructured isolation layer 1228 from the structure of FIG. 20 using a dry etch process or a wet etch process to form the structure of FIG. 21.

Figure 22:
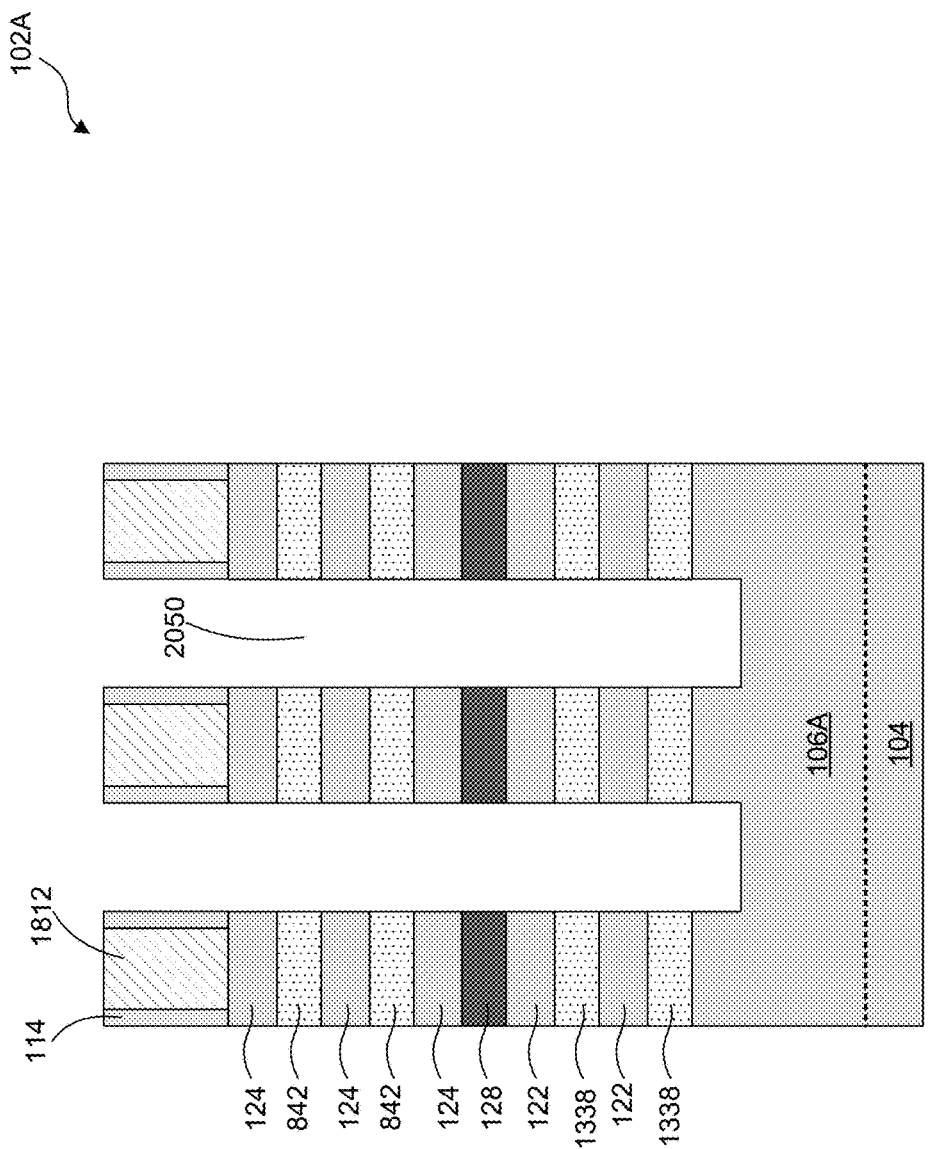
Figure 23:
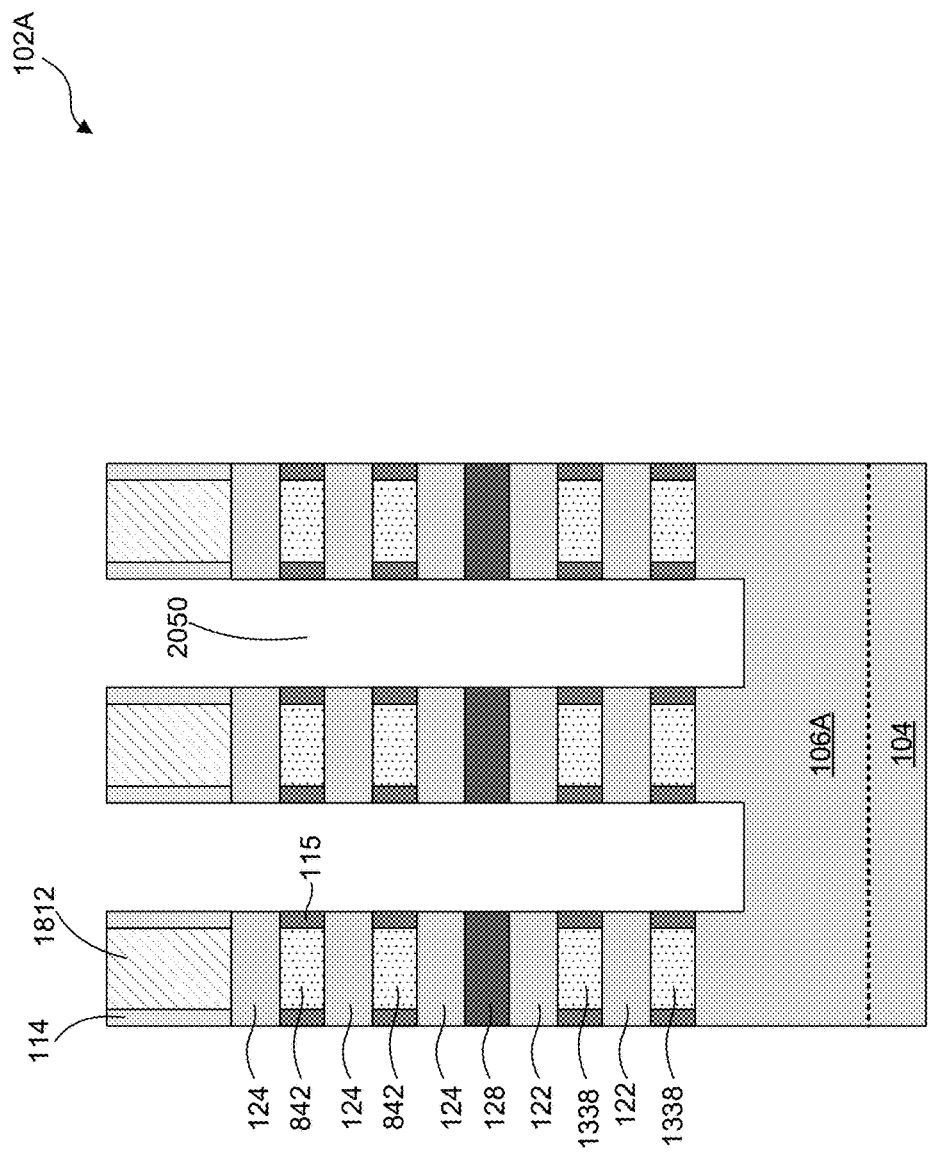
Figure 24:
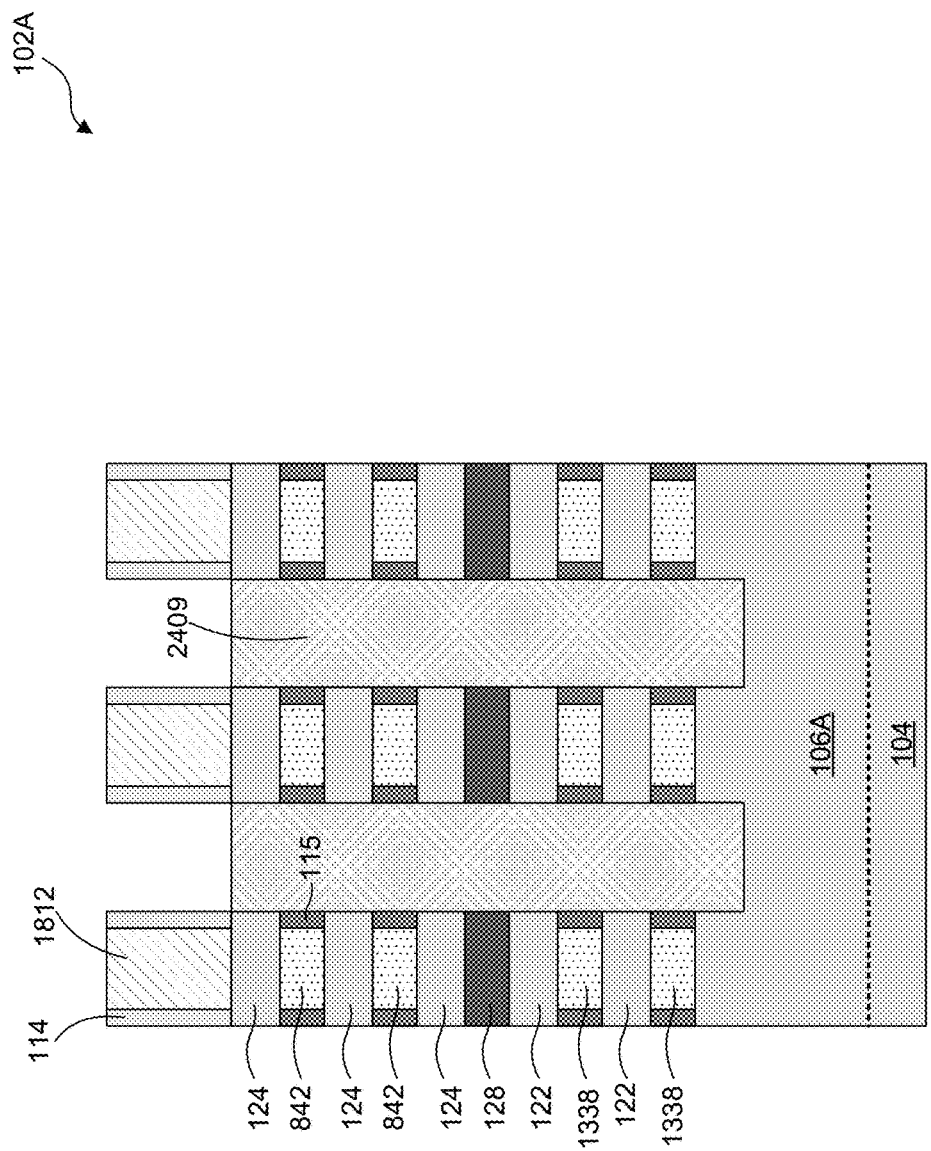

Referring to FIG. 2, in operation 235, the S/D openings are extended to the fin structure. For example, as shown in FIG. 22, S/D openings 2050 are extended to fin structure 106A. S/D openings 2050 can be extended by etching the exposed portions of second superlattice structure 1337 from the structure of FIG. 21 to form the structure of FIG. 22. Following the extension of S/D openings 2050, nanostructured channel regions 122 are formed, as shown in FIG. 22. In some embodiments, nanostructured layers 1338 are considered sacrificial layers and are replaced with gate structures in subsequent processing. Further, following the extension of S/D openings 2050, inner spacers 115 can be formed, as shown in FIG. 23.

Figure 25:
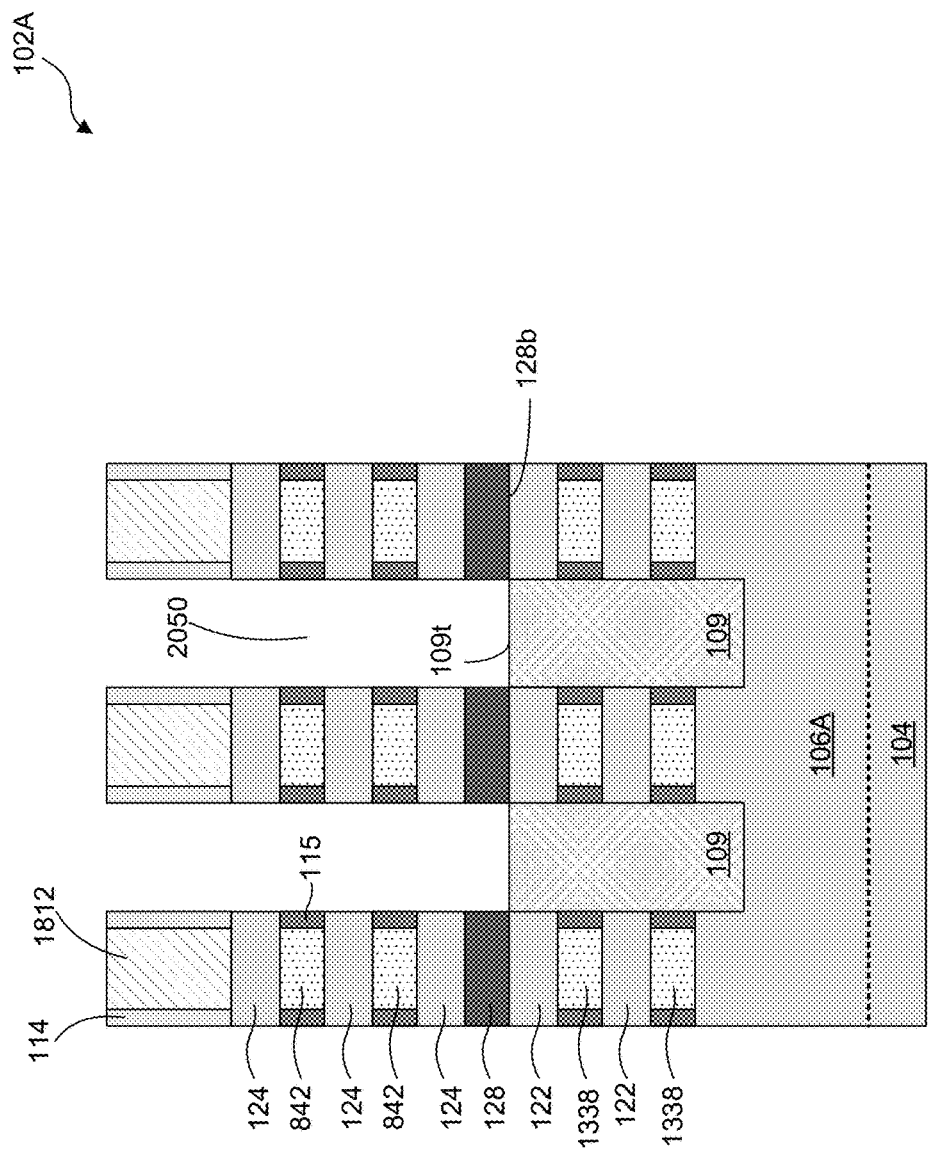
Figure 26:
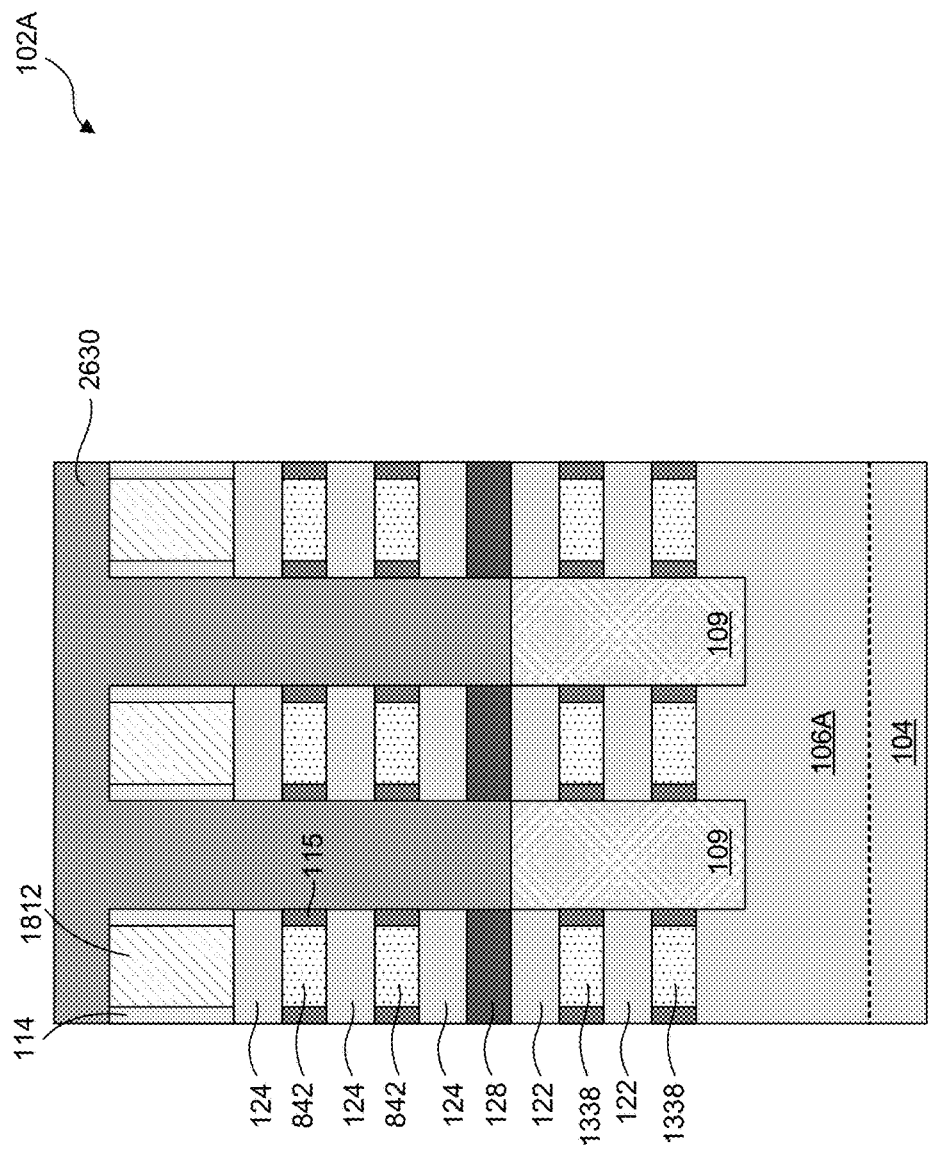

Referring to FIG. 2, in operation 240, first conductivity type S/D regions are formed within the S/D openings. For example, as described with FIGS. 24-25, first conductivity type S/D regions 109 are formed within S/D openings 2050 and on fin structure 106A. The formation of first conductivity type S/D regions 109 can include sequential operations of (i) epitaxially growing a semiconductor layer 2409 with a first conductivity type dopants (e.g., p-type dopants) within S/D openings 2050 of FIG. 23 to form the structure of FIG. 24, and (ii) etching semiconductor layer 2409 from the structure of FIG. 24 to form S/D regions 109, as shown in FIG. 25. In some embodiments, top surfaces of S/D regions 109 can be substantially coplanar with bottom surfaces 128b of channel isolation layers 128.

Figure 27:
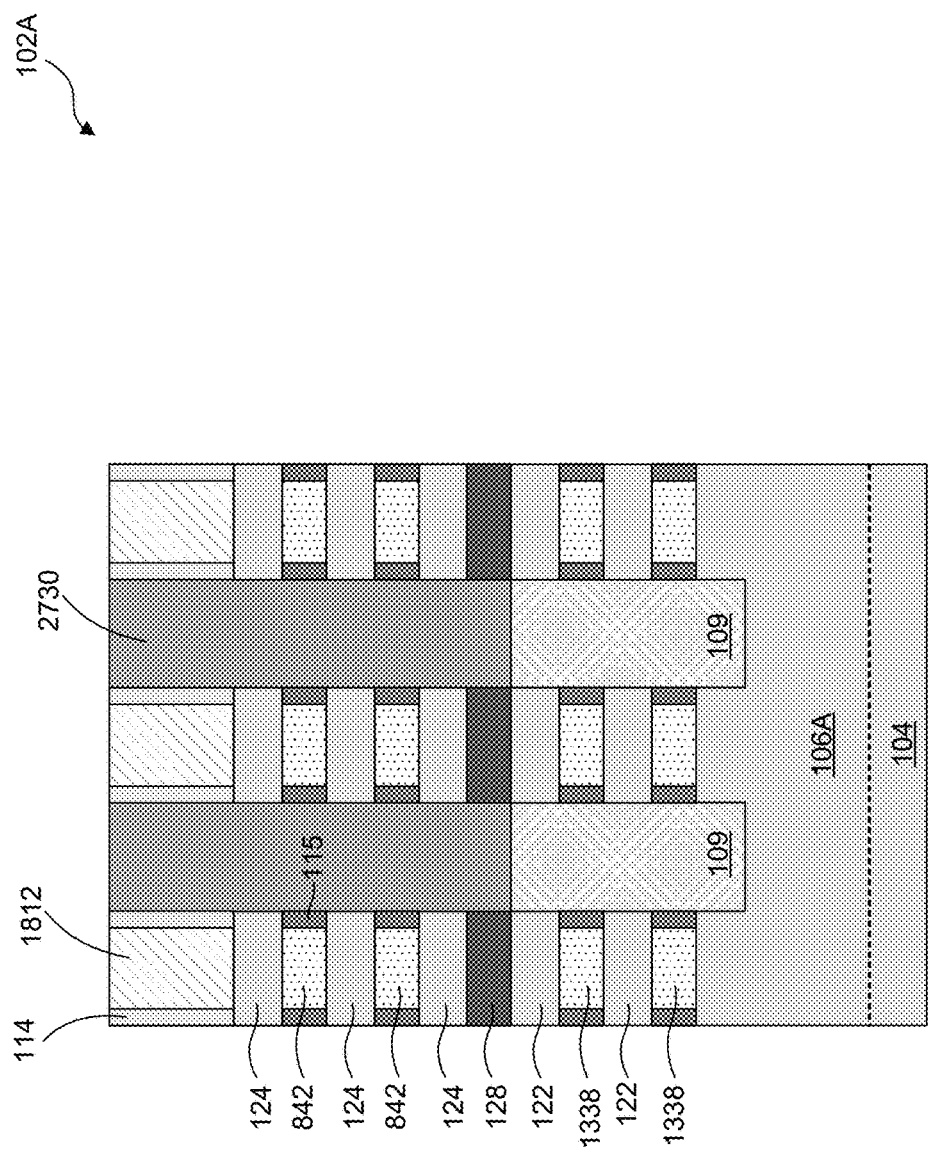
Figure 28:
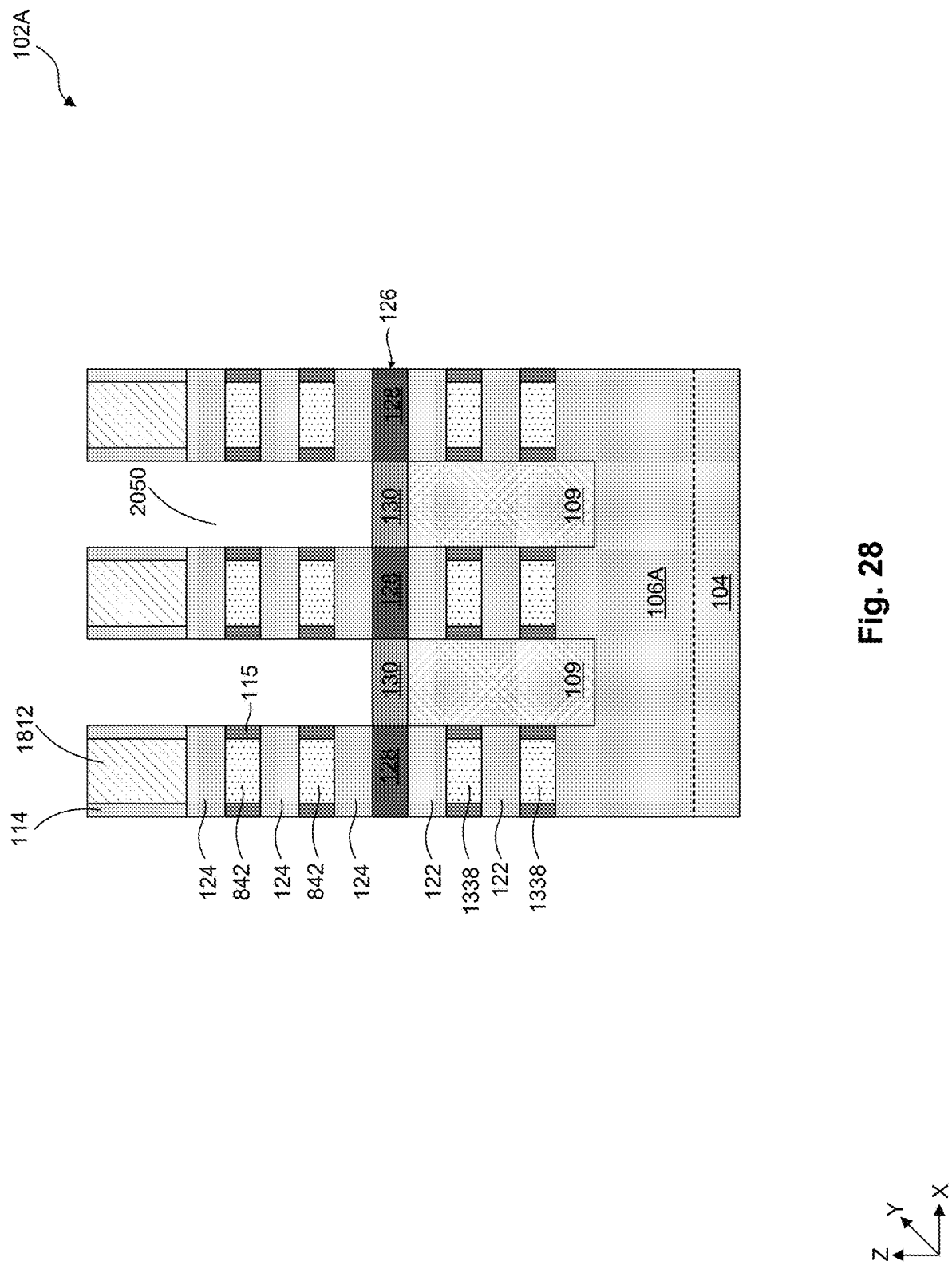

Referring to FIG. 2, in operation 245, S/D isolation layers are formed on the first conductivity type S/D regions. For example, as described with reference to FIGS. 26-28, S/D isolation layers 130 are formed on first conductivity type S/D regions 109. The formation of S/D isolation layers 130 can include sequential operations of (i) depositing a dielectric layer 2630 on the structure of FIG. 25 to form the structure of FIG. 26, (ii) performing a chemical mechanical polishing (CMP) process on the structure of FIG. 26 to substantially coplanarize top surfaces of dielectric layer 2630 with top surfaces of polysilicon structures 1812 to form dielectric layers 2730, as shown in FIG. 27, and (iii) etching dielectric layers 2730 to form S/D isolation layers 130, as shown in FIG. 28.

Figure 29:
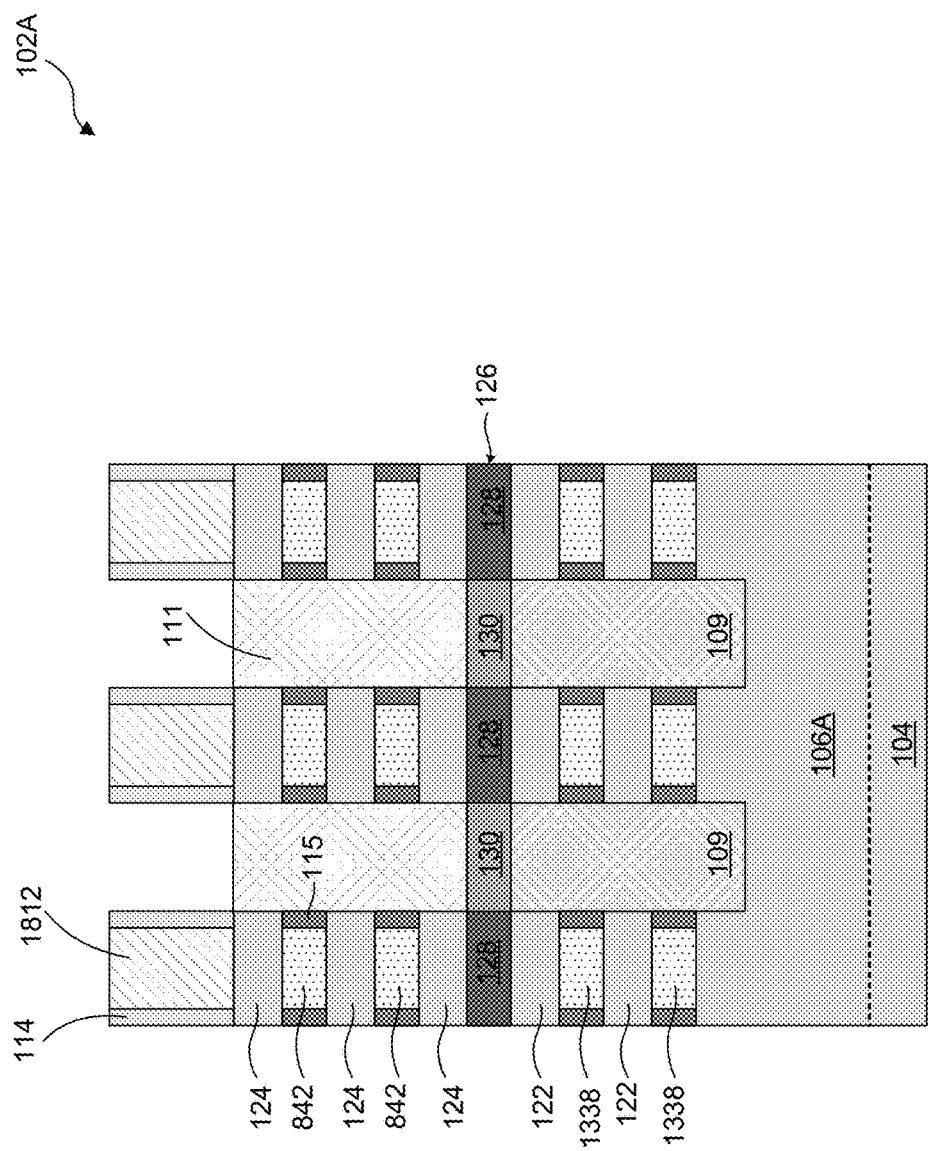
Figure 30:
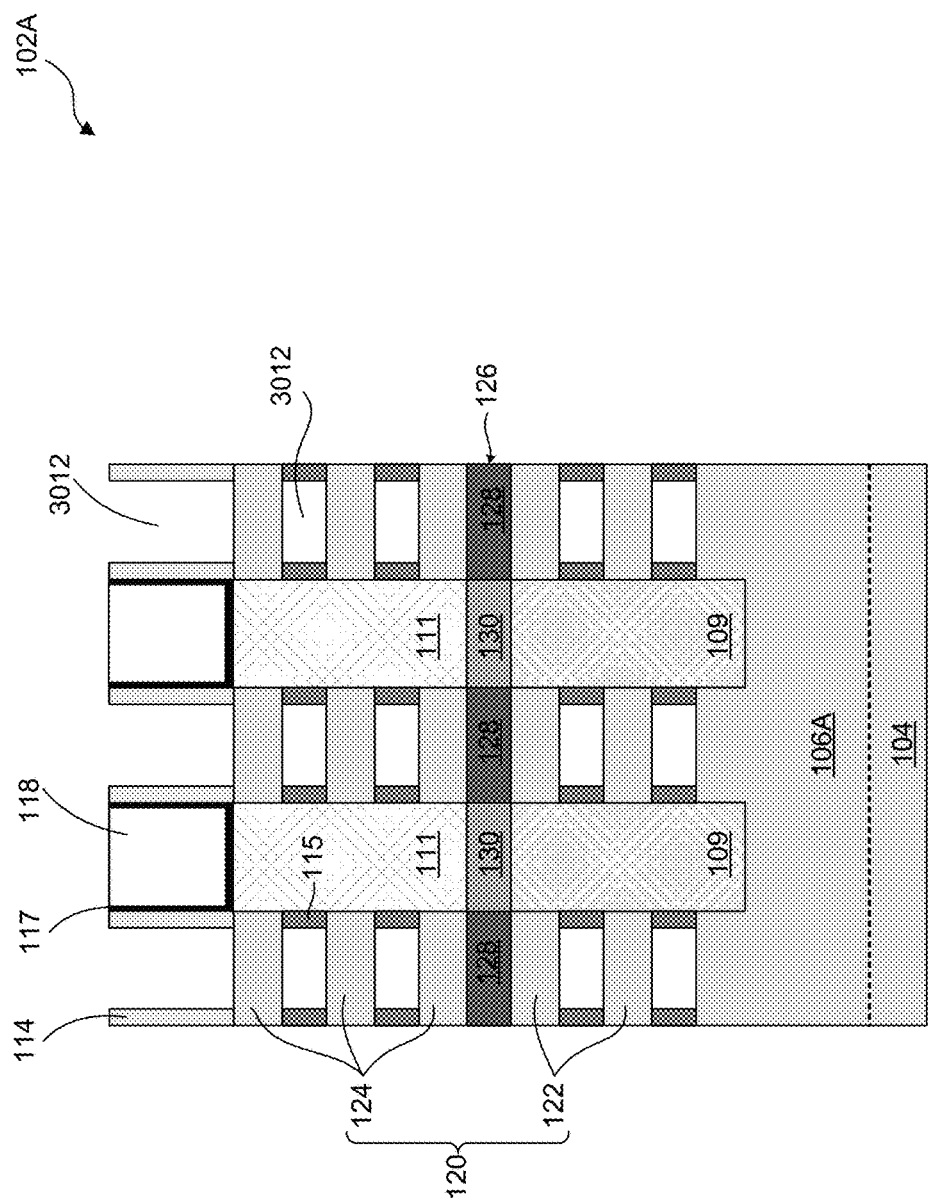

Referring to FIG. 2, in operation 250, second conductivity type S/D regions are formed on the S/D isolation layers. For example, as shown in FIG. 29, second conductivity type S/D regions 111 are formed within S/D openings 2050 and on S/D isolation layers 130. The formation of second conductivity type S/D regions 111 can include sequential operations of (i) epitaxially growing a semiconductor layer (not shown) different from semiconductor layer 2409 with a second conductivity type dopants (e.g., n-type dopants) within S/D openings 2050 of FIG. 28, and (ii) etching the semiconductor layer to form S/D regions 111, as shown in FIG. 29. In some embodiments, top surfaces of S/D regions 111 can be substantially coplanar with bottom surfaces of polysilicon structures 1812, as shown in FIG. 29. Following the formation of S/D regions 111, ESL 117 and ILD layer 118 can be formed, as shown in FIG. 30.

Figure 31:
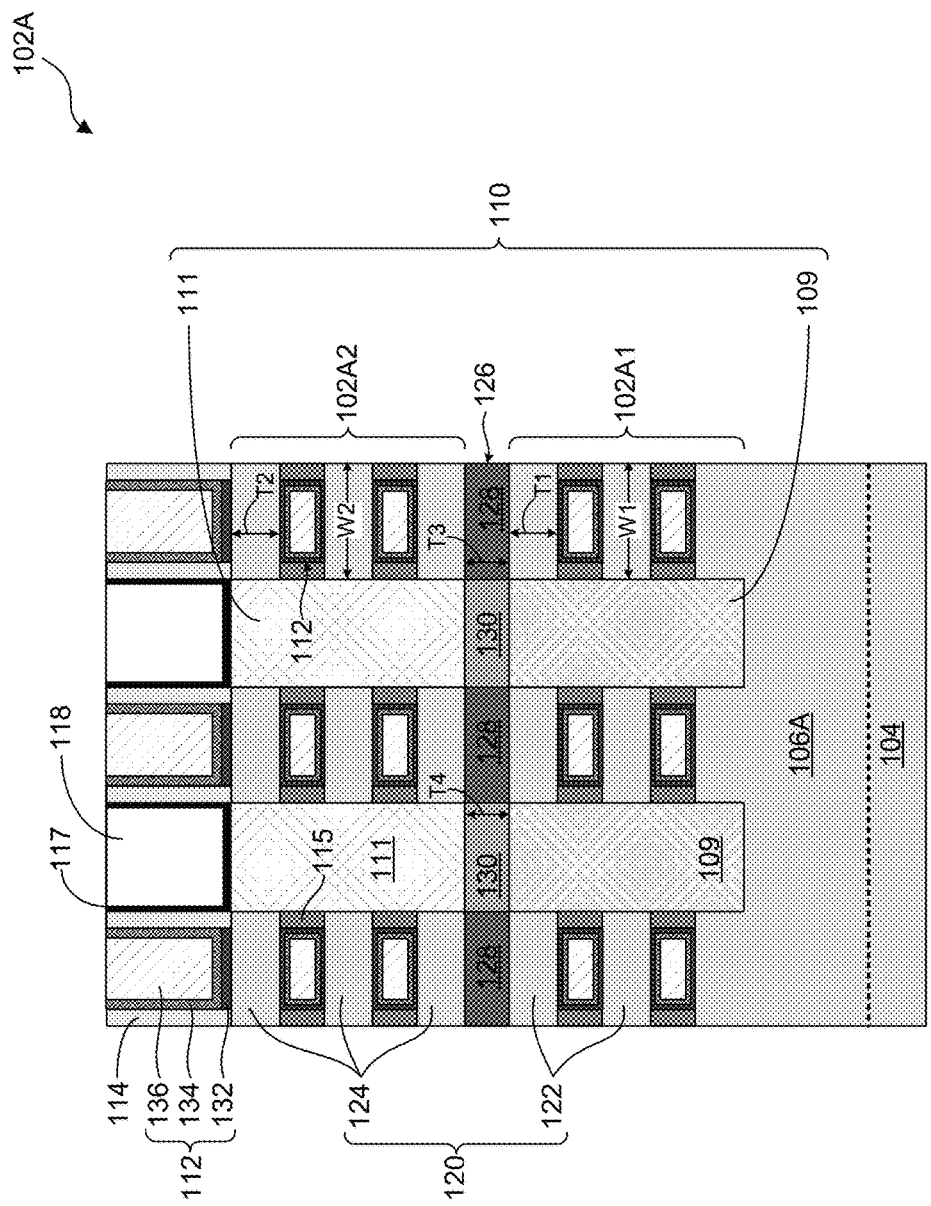

Referring to FIG. 2, in operation 255, the polysilicon structures and sacrificial layers of the stacked superlattice structures are replaced with gate structures. For example, as described with reference to FIGS. 30-31, polysilicon structures 1812 and sacrificial layers 842 and 1338 of stacked superlattice structure 1341 are replaced to form gate structures 112. The formation of gate structures 112 can include sequential operations of (i) removing polysilicon structures 1812 and layers 842 and 1338 from the structure of FIG. 29 to form gate openings 3012, as shown in FIG. 30, (ii) forming IO oxide layers 132 within gate openings 3012, as shown in FIG. 31, (iii) forming HK dielectric layers 134 on IO oxide layers 132 within gate openings 3012, as shown in FIG. 31, and (iv) forming conductive layers 136 on HK dielectric layers 134 within gate openings 3012, as shown in FIG. 31.

Figure 32:
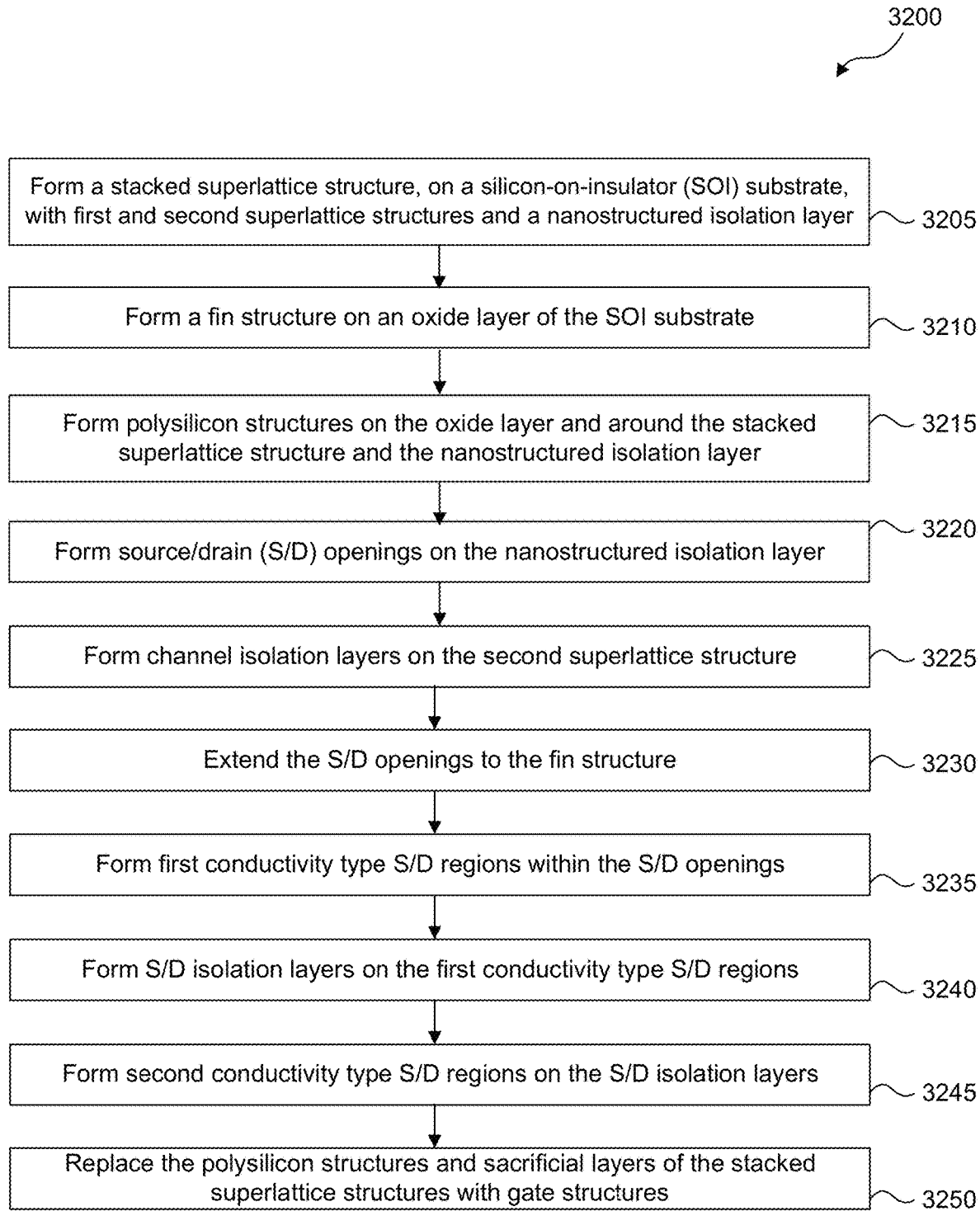
FIG. 32 is a flow diagram of a method for fabricating another semiconductor device stacked FETs, in accordance with some embodiments.
Figure 33:
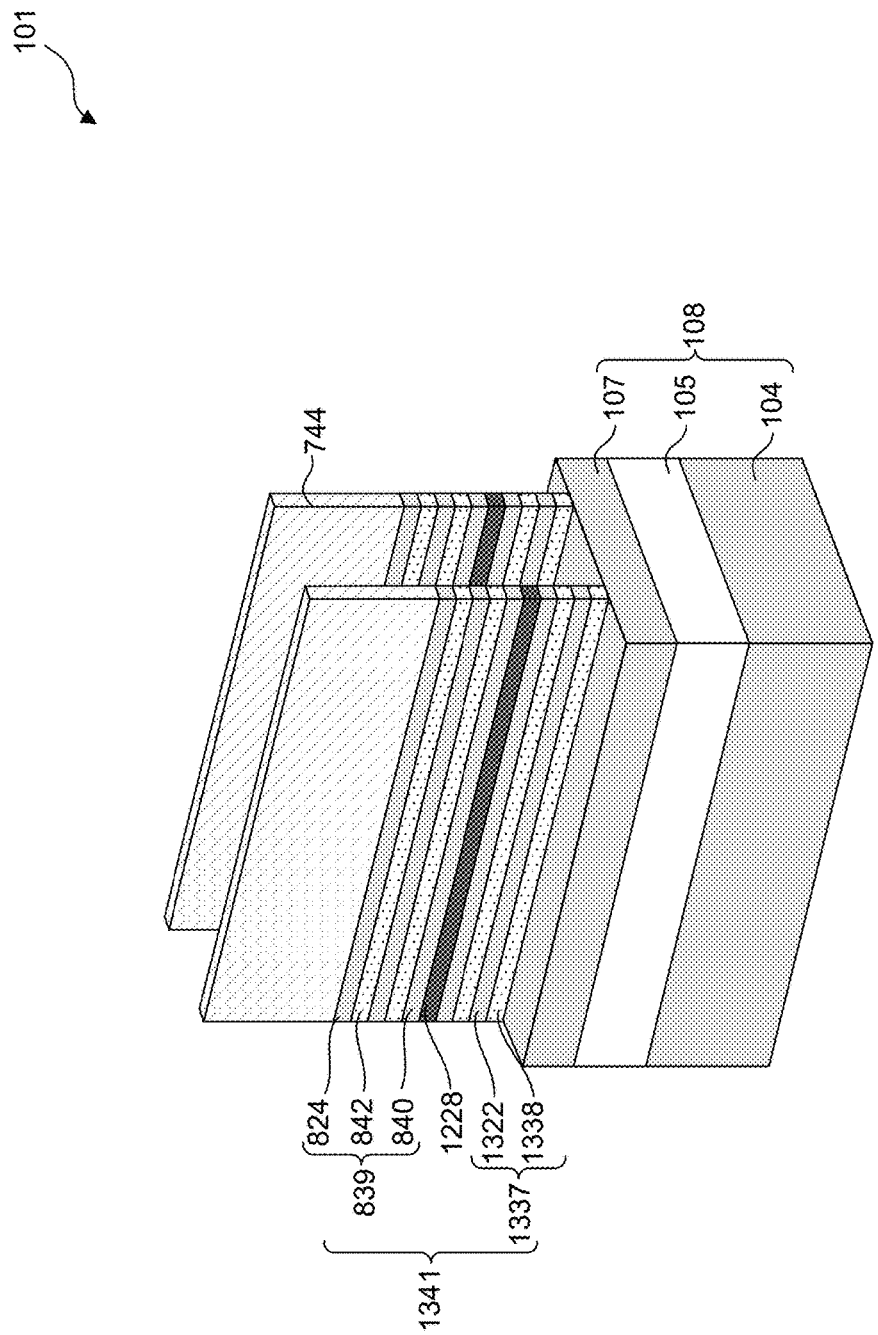
FIGS. 33-35 illustrate isometric views of another semiconductor device with stacked FETs at various stages of its fabrication process, in accordance with some embodiments.
Figure 34:
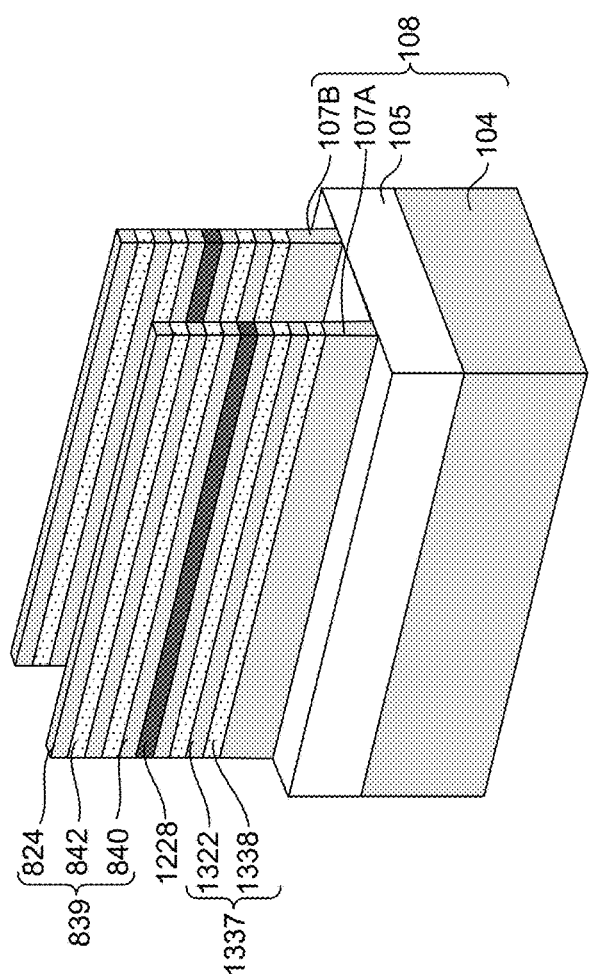
Figure 35:
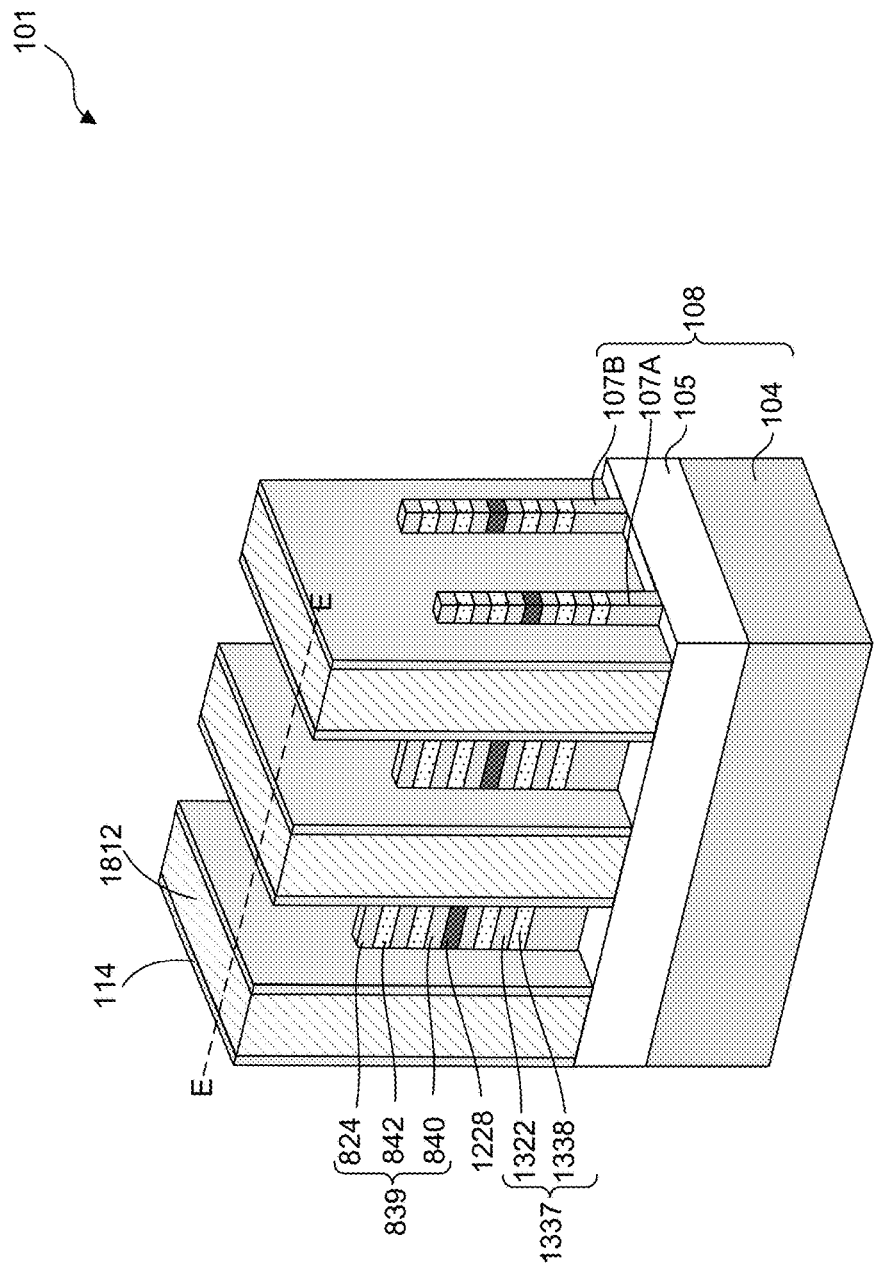
Figure 36:
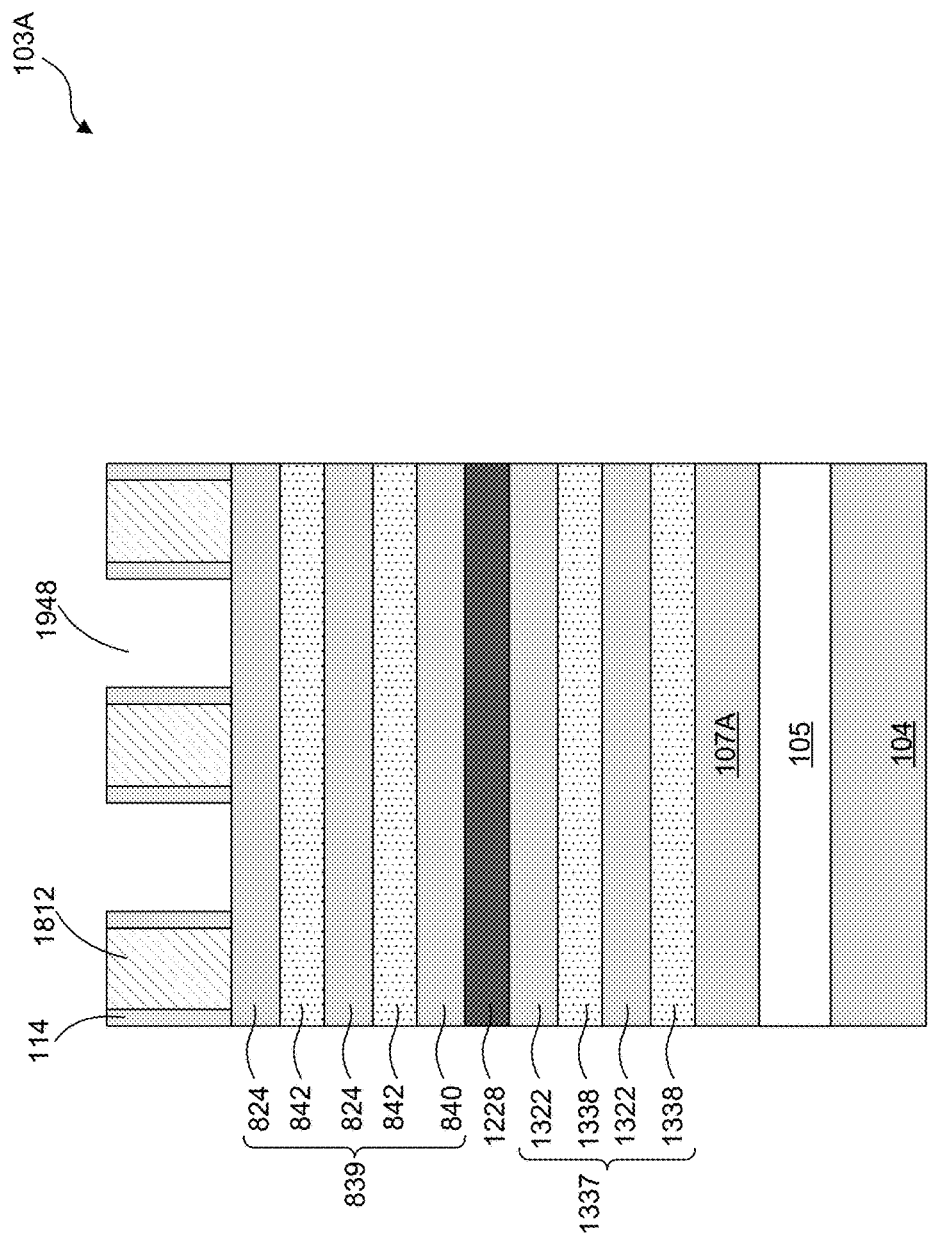
FIGS. 36-37 illustrate cross-sectional views of another semiconductor device with stacked FETs at various stages of its fabrication process, in accordance with some embodiments.
Figure 37:
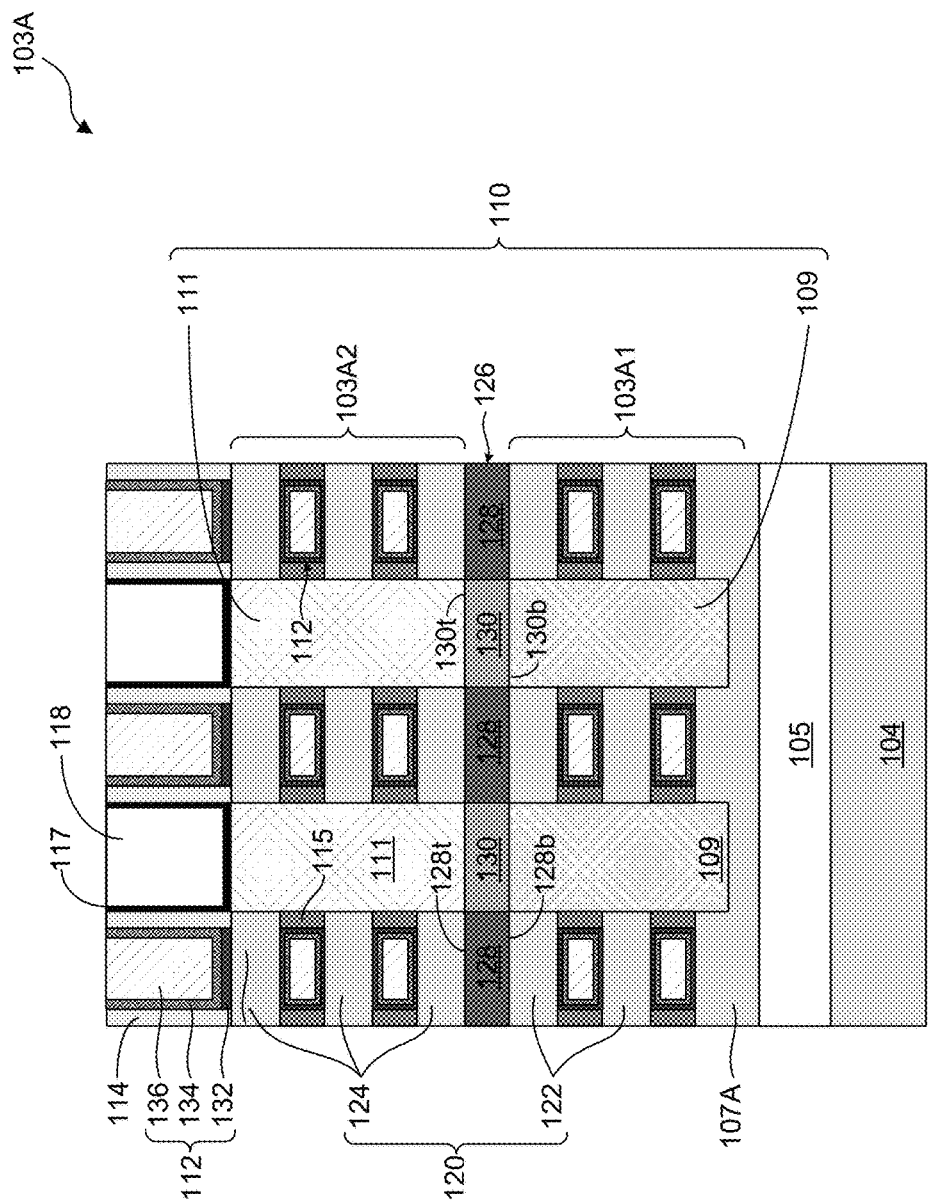

FIG. 32 is a flow diagram of an example method 3200 for fabricating semiconductor device 101 with cross-sectional view shown in FIGS. 1I-1J, according to some embodiments. For illustrative purposes, the operations illustrated in FIG. 32 will be described with reference to the example fabrication process for fabricating stacked GAA 103A of semiconductor device 101 as illustrated in FIGS. 33-38. The discussion of fabricating stacked GAA 103A applies to the operations of fabricating stacked GAA 103B, unless mentioned otherwise. FIGS. 33-35 are isometric views of semiconductor device 101 at various stages of fabrication, according to some embodiments. FIGS. 36-37 are cross-sectional views of stacked GAA FET 103A along line A-A of FIG. 1H at various stages of fabrication, according to some embodiments. Operations can be performed in a different order or not performed depending on specific applications. It should be noted that method 200 may not produce a complete semiconductor device 101. Accordingly, it is understood that additional processes can be provided before, during, and after method 3200, and that some other processes may only be briefly described herein. Elements in FIGS. 3-31 and 33-38 with the same annotations as elements in FIGS. 1A-1J are described above.

Referring to FIG. 32, operation 3205 is similar to operation 205 of FIG. 2, except the operations for forming stacked superlattice structure 1341 is performed on Si layer 107 of SOI substrate 108 instead of substrate 104 to form the structure of FIG. 33.

Referring to FIG. 32, in operation 3210, a fin structure is formed on an oxide layer of the SOI substrate. For example, as shown in FIG. 34, fin structures 107A-107B are formed on oxide layer 105 of SOI substrate 108.

Referring to FIG. 32, in operation 3215, polysilicon structures are formed on the oxide layer and around the stacked superlattice structure and the nanostructured isolation layer. For example, as shown in FIG. 35, polysilicon structures 1812 are formed on oxide layer 105 and around stacked superlattice structure 1341. Following the formation of polysilicon structures 1812, gate spacers 114 are formed on the sidewalls of polysilicon structures 1812, as shown in FIG. 35. FIG. 36 shows a cross-sectional view along line E-E of FIG. 35.

Referring to FIG. 32, operations 3220-3250 are similar to operations 225-255, respectively, and are performed on the structure of FIG. 36 to form the structure of FIG. 37.

The present disclosure provides example semiconductor devices (e.g., semiconductor devices 100 and 101) with stacked FETs (e.g., stacked GAA FETs 102A-102B and 103A-103B) and example methods of forming the same. With the use of stacked FETs, the device density of ICs can be increased without aggressively scaling down the devices and compromising the electrical isolation between the devices in the IC. In some embodiments, the stacked FET can include a first conductivity type (e.g., n-type) FET (e.g., GAA FET 102A2) disposed on a second conductivity type (e.g., p-type) FET (e.g., GAA FET 102A1). The stacked FET can further include a FET isolation layer (e.g., FET isolation layer 126) disposed between the first and second conductivity type FETs to electrically isolate them from each other. In some embodiments, the FET isolation layer can include a channel isolation layer (e.g., channel isolation layers 128) and a S/D isolation layer (e.g., S/D isolation layers 130). The channel isolation layer can electrically isolate the channel regions (e.g., nanostructured channel regions 122 and 124) of the first and second conductivity type FETs from each other. The S/D isolation layer can electrically isolate the S/D regions (e.g., S/D regions 109 and 111) of the first and second conductivity type FETs from each other.

In some embodiments, the first and second conductivity type FETs can include GAA FETs. The first conductivity type GAA FET can include a stack of first conductivity type nanostructured channel regions and the second conductivity type GAA FET can include a stack of second conductivity type nanostructured channel regions. In some embodiments, the semiconductor materials of the first and second conductivity type nanostructured channel regions can be the same or can be different from each other. The stack of first conductivity type nanostructured channel regions can be disposed on and electrically isolated from the stack of second conductivity type nanostructured channel regions by the channel isolation layer. In some embodiments, the first and second conductivity type nanostructured channel regions can be surrounded by a common multi-layered gate structure.

In some embodiments, the stacked GAA FETs can be formed on a semiconductor substrate or on a SOI substrate (e.g., SOI substrate 108). The formation of the stacked GAA FETs on the SOI substrate can eliminate the need for electrical isolation with STI regions between adjacent stacked GAA FETs and/or between stack GAA FETs and other devices on the SOI substrate. The buried oxide layer of the SOI substrate can electrically isolate stacked GAA FETs from adjacent devices. As a result, the formation of the stacked GAA FETs on the SOI substrate can simplify the device fabrication process and reduce device manufacturing cost by eliminating the STI region fabrication steps.

In some embodiments, a method includes forming a fin structure on a substrate, forming a superlattice structure with first and second nanostructured layers on the fin structure, forming a polysilicon structure around the superlattice structure, forming a source/drain opening within the superlattice structure, forming a first conductivity type S/D region within a first portion of the S/D opening, forming an isolation layer on the first conductivity type S/D region and within a second portion of the S/D opening, forming a second conductivity type S/D region on the isolation layer and within a third portion the S/D opening, and replacing the polysilicon structure and the second nanostructured layers with a gate structure that surrounds the first nanostructured layers. Materials of the first and second nanostructured layers are different from each other and the second conductivity type is different from the first conductivity type.

In some embodiments, a method includes forming a superlattice structure with first and second nanostructured layers on a silicon layer of an SOI substrate, forming a fin structure on an oxide layer of the SOI substrate by etching the silicon layer of the SOI substrate, forming a polysilicon structure on the oxide layer and around the superlattice structure, forming a first conductivity type S/D region on the fin structure, forming an isolation layer on the first conductivity type S/D region, forming a second conductivity type S/D region on the isolation layer, wherein the second conductivity type is different from the first conductivity type, and replacing the polysilicon structure and the second nanostructured layers with a gate structure that surrounds the first nanostructured layers. Materials of the first and second nanostructured layers are different from each other.

In some embodiments, a semiconductor device includes a substrate a fin structure disposed on the substrate, first and second nanostructured channel regions disposed on a first portion of the fin structure, a first isolation layer disposed between the first and second nanostructured channel regions, first and second S/D regions disposed on a second portion of the fin structure, a second isolation disposed between the first and second S/D regions, and a gate structure surrounding the first and second nanostructured channel regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a superlattice structure with first and second nanostructured layers and a nanostructured dielectric layer on a substrate, wherein materials of the first and second nanostructured layers are different from each other;
    forming a polysilicon structure around the first and second nanostructured layers and the nanostructured dielectric layer of the superlattice structure;
    forming a source/drain (S/D) opening within the superlattice structure;
    forming a first conductivity type S/D region within a first portion of the S/D opening;
    forming an isolation layer on the first conductivity type S/D region and within a second portion of the S/D opening;
    forming a second conductivity type S/D region on the isolation layer and within a third portion the S/D opening, wherein the second conductivity type is different from the first conductivity type; and
    replacing the polysilicon structure and the second nanostructured layers with a gate structure that surrounds the first nanostructured layers.

2. The method of claim 1, wherein the forming the superlattice structure comprises:
    epitaxially growing a first stack of semiconductor layers on the substrate;
    depositing a dielectric layer on the first stack of semiconductor layers;
    depositing a seed layer on the dielectric layer; and
    epitaxially growing a second stack of semiconductor layers.

3. The method of claim 1, wherein the forming the superlattice structure comprises forming a stack of first and second nanostructured layers arranged in an alternating configuration, wherein the materials of the first and second nanostructured layers are different from each other.

4. The method of claim 1, wherein the forming the superlattice structure comprises:
    forming a stack of semiconductor layers on the substrate;
    performing a chlorine-based plasma process on the stack of semiconductor layers to form a stack of nanostructured layers with tapered sidewalls; and
    performing a fluorine-based plasma process on the stack of nanostructured layers to modify the tapered sidewalls to substantially vertical sidewalls.

5. The method of claim 1, wherein the forming the superlattice structure comprises:
    forming a first superlattice structure with a first stack of the first and second nanostructured layers on the substrate;
    forming the nanostructured dielectric layer on the first superlattice structure; and
    forming a second superlattice structure with a second stack of the first and second nanostructured layers on the nanostructured dielectric layer.

6. The method of claim 5, further comprising etching the nanostructured dielectric layer to form an other isolation layer within the superlattice structure.

7. The method of claim 5, wherein the forming the S/D opening comprises:
    forming the first portion of the S/D opening through the first superlattice structure;
    forming the second portion of the S/D opening through the nanostructured dielectric layer; and
    forming the third portion of the S/D opening through the second superlattice structure.

8. The method of claim 1, wherein the forming the superlattice structure comprises forming the nanostructured dielectric layer with faceted side surfaces.

9. The method of claim 1, wherein the forming the superlattice structure comprises forming the nanostructured dielectric layer with tapered side surfaces.

10. The method of claim 1, wherein the forming the first conductivity type S/D region comprises:
    epitaxially growing a semiconductor layer on the substrate to fill the S/D opening; and etching a portion of the semiconductor layer to expose the second and third portions of the S/D opening.

11. The method of claim 1, wherein the forming the isolation layer comprises:
depositing a dielectric layer on the first conductivity type S/D region to fill the S/D opening; and
etching a portion of the dielectric layer to expose the third portion of the S/D opening.

12. A method, comprising:
forming a superlattice structure with first and second nanostructured layers on a silicon layer of a silicon-on-insulator (SOI) substrate, wherein materials of the first and second nanostructured layers are different from each other;
forming a fin structure on an oxide layer of the SOI substrate by etching the silicon layer of the SOI substrate;
forming a polysilicon structure on the oxide layer and around the superlattice structure;
forming an opening in the superlattice structure;
forming a first conductivity type source/drain (S/D) region in the opening;
depositing a dielectric layer directly on the first conductivity type S/D region;
performing a polishing process to coplanarize top surfaces of the dielectric layer and the polysilicon structure;
etching the dielectric layer to form an isolation layer on the first conductivity type S/D region;
forming a second conductivity type S/D region on the isolation layer, wherein the second conductivity type is different from the first conductivity type; and
replacing the polysilicon structure and the second nanostructured layers with a gate structure that surrounds the first nanostructured layers.

13. The method of claim 12, wherein the forming the superlattice structure comprises:
forming a first stack of the first and second nanostructured layers having first conductivity type dopants;
forming a nanostructured dielectric layer on the first stack of the first and second nanostructured layers; and
forming a second stack of the first and second nanostructured layers having second conductivity type dopants on the nanostructured dielectric layer, wherein the second conductivity type dopants are different from the first conductivity type dopants.

14. The method of claim 13, further comprising etching the nanostructured dielectric layer to form an other isolation layer within the superlattice structure.

15. The method of claim 14, wherein the forming the isolation layer comprises forming a top surface of the isolation layer substantially coplanar with a top surface of the other isolation layer.

16. A semiconductor device, comprising:
a substrate;
first and second nanostructured channel regions disposed on a first portion of the substrate;
a first isolation layer disposed between the first and second nanostructured channel regions and in physical contact with the first and second nanostructured channel regions;
first and second source/drain (S/D) regions disposed on a second portion of the substrate;
a second isolation disposed between the first and second S/D regions; and
a gate structure surrounding the first and second nanostructured channel regions.

17. The semiconductor device of claim 16, wherein the first nanostructured channel region comprises dopants of a first conductivity type and the second nanostructured channel region comprises dopants of a second conductivity type that is different from the first conductivity type.

18. The semiconductor device of claim 16, wherein the first S/D region comprises dopants of a first conductivity type and the second S/D regions comprises dopants of a second conductivity type that is different from the first conductivity type.

19. The semiconductor device of claim 16, wherein the first isolation layer comprises tapered sidewalls.

20. The semiconductor device of claim 16, wherein the first and second nanostructured channel regions comprise semiconductor materials different from each other.

* * * * *